United States Patent
Chen

(10) Patent No.: US 10,332,936 B2
(45) Date of Patent: Jun. 25, 2019

(54) 3D STACKING SEMICONDUCTOR DEVICE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 58 days.

(21) Appl. No.: 15/490,946

(22) Filed: Apr. 19, 2017

(65) Prior Publication Data

US 2018/0308748 A1 Oct. 25, 2018

(51) Int. Cl.
*H01L 29/788* (2006.01)
*H01L 27/24* (2006.01)
(Continued)

(52) U.S. Cl.
CPC .... *H01L 27/2481* (2013.01); *H01L 21/76816* (2013.01); *H01L 21/76877* (2013.01);
(Continued)

(58) Field of Classification Search
CPC .......... H01L 21/76816; H01L 23/5226; H01L 21/76877; H01L 23/5283; H01L 27/11582; H01L 27/1157; H01L 27/11575; H01L 27/11565; H01L 27/11573; H01L 27/11556; H01L 27/11524; H01L 23/528; H01L 27/11548; H01L 27/11519;
(Continued)

(56) References Cited

U.S. PATENT DOCUMENTS 8,383,512 B2  2/2013 Chen et al.
8,541,882 B2  9/2013 Chen et al.
(Continued)

FOREIGN PATENT DOCUMENTS

CN  106024786 A  10/2016
TW  201428843 A  7/2014
(Continued)

OTHER PUBLICATIONS

TIPO Office Action dated Apr. 16, 2018 in Taiwan application (No. 106112732).

*Primary Examiner* — Shouxiang Hu
(74) *Attorney, Agent, or Firm* — McClure, Qualey & Rodack, LLP

(57) ABSTRACT

A 3D stacking semiconductor device and a manufacturing method thereof are provided. The method includes using a set of N etch masks for creating O different numbers of removed layers in the conductive layers and the insulating layers for forming landing areas on the conductive layers in the contact region, each mask including mask and etch regions, N being an integer equal to or larger than 2, O being an integer larger than 2, $2^{N-1} < O \leq 2^N$; and removing a portion of the conductive layers and the insulating layers to create etched depths extending from a surface layer to the corresponding landing areas on the conductive layers; wherein the etched depths of corresponding etching steps are 1P, 2P and nP layers of the stacking structures, n being an integer equal to or larger than 3, and P being an integer equal to or larger than 1.

6 Claims, 37 Drawing Sheets

(51) Int. Cl.
  *H01L 21/768* (2006.01)
  *H01L 27/11565* (2017.01)
  *H01L 27/1157* (2017.01)
  *H01L 27/11573* (2017.01)
  *H01L 27/11524* (2017.01)
  *H01L 27/11519* (2017.01)
  *H01L 29/792* (2006.01)
  *H01L 29/66* (2006.01)
  *H01L 23/28* (2006.01)
  *H01L 27/11548* (2017.01)
  *H01L 27/11556* (2017.01)
  *H01L 27/11575* (2017.01)
  *H01L 27/11582* (2017.01)

(52) U.S. Cl.
  CPC .......... *H01L 23/28* (2013.01); *H01L 27/1157* (2013.01); *H01L 27/11519* (2013.01); *H01L 27/11524* (2013.01); *H01L 27/11548* (2013.01); *H01L 27/11556* (2013.01); *H01L 27/11565* (2013.01); *H01L 27/11573* (2013.01); *H01L 27/11575* (2013.01); *H01L 27/11582* (2013.01); *H01L 29/66833* (2013.01); *H01L 29/7926* (2013.01)

(58) Field of Classification Search
  CPC ......... H01L 27/11529; H01L 27/11578; H01L 29/7926; H01L 27/11526; H01L 29/66833; H01L 27/11551
  See application file for complete search history.

(56) References Cited

U.S. PATENT DOCUMENTS

| | | |
|---|---|---|
| 8,598,032 B2 | 12/2013 | Chen et al. |
| 8,759,217 B1 | 6/2014 | Chen |
| 9,165,938 B1* | 10/2015 | Kim ...................... H01L 27/115 |
| 9,859,297 B2* | 1/2018 | Park .................. H01L 27/11575 |
| 2013/0341798 A1 | 12/2013 | Freeman et al. |
| 2014/0191388 A1 | 7/2014 | Chen |
| 2014/0193973 A1 | 7/2014 | Chen |
| 2014/0335695 A1 | 11/2014 | Luere et al. |
| 2015/0011027 A1 | 1/2015 | Lian |
| 2015/0228623 A1 | 8/2015 | Oh et al. |
| 2016/0240548 A1 | 8/2016 | Chen et al. |
| 2016/0293539 A1 | 10/2016 | Park et al. |
| 2016/0365351 A1* | 12/2016 | Nishikawa .......... H01L 27/1157 |
| 2016/0365407 A1 | 12/2016 | Lue et al. |
| 2018/0040629 A1* | 2/2018 | Eom .................... H01L 27/11575 |

FOREIGN PATENT DOCUMENTS

| | | |
|---|---|---|
| TW | 201628130 A | 8/2016 |
| TW | 201644079 A | 12/2016 |

* cited by examiner

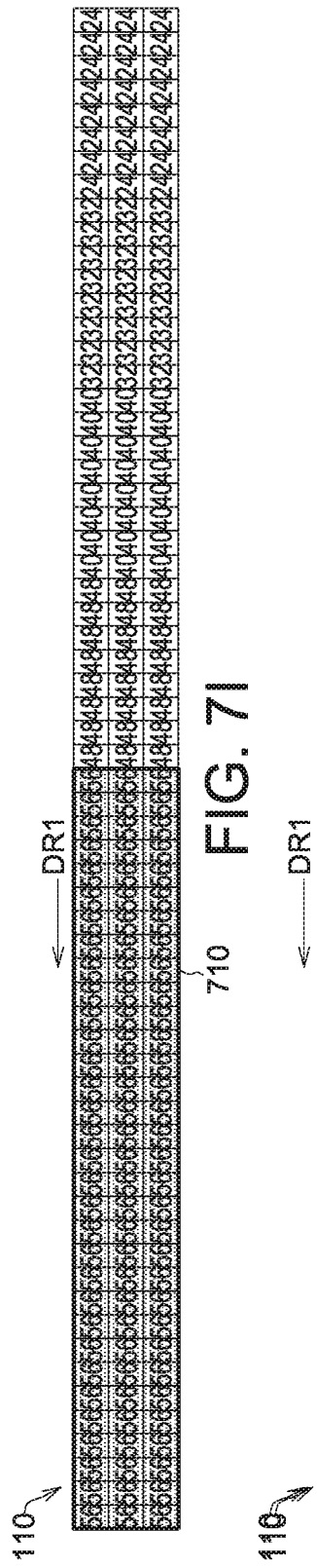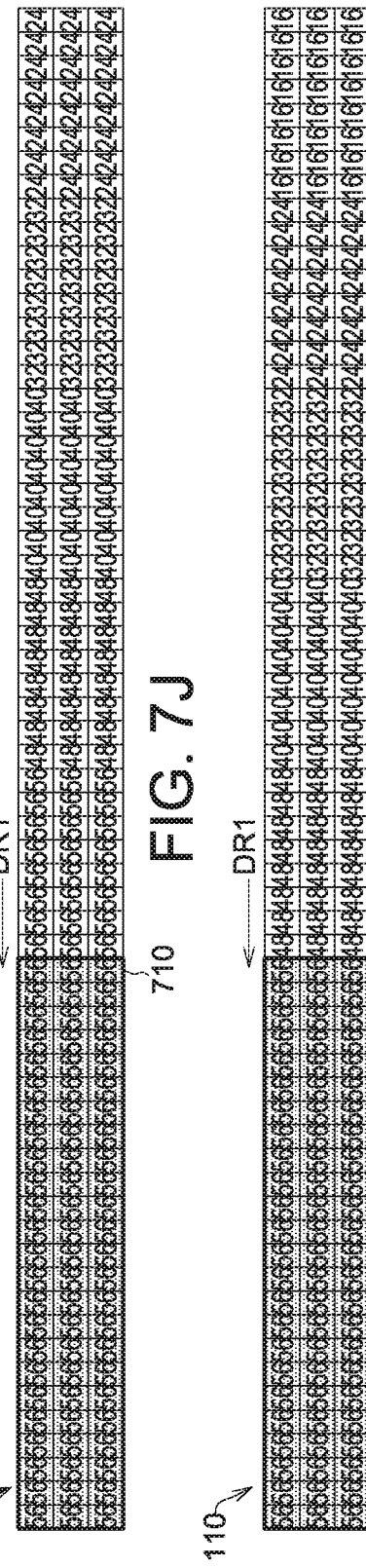

3D STACKING SEMICONDUCTOR DEVICE

BACKGROUND

Technical Field

The present disclosure relates in general to a semiconductor device and a manufacturing method thereof, and particularly to a 3D stacking semiconductor device and a manufacturing method thereof.

Description of the Related Art

With the development of semiconductor technology, various semiconductor elements are provided. The semiconductor elements can be installed to realize varied electric performance. Semiconductor elements are widely used in electronic products.

Under the trends of lightweight, thin, short and small, how to reduce the volume of the semiconductor element or increase the circuit density at a fixed volume becomes an important target in the semiconductor industries.

SUMMARY

The disclosure is directed to a 3D stacking semiconductor device and a manufacturing method thereof.

According to an aspect of the present disclosure, a manufacturing method of a 3D stacking semiconductor device is provided. The 3D stacking semiconductor device includes a plurality layers of stacking structures and has an array region and a contact region, each of the stacking structures includes a conductive layer and an insulating layer, the conductive layers and the insulating layers are interlaced, the method is for forming a plurality of interlayer connectors in the contact region, and each of the interlayer connectors is connected to each of the corresponding conductive layers. The manufacturing method of the 3D stacking semiconductor device includes the following steps: using a set of N etch masks for creating O different numbers of removed layers in the conductive layers and the insulating layers in the contact region for forming a plurality of landing areas on the conductive layers in the contact region, the landing areas without overlying the conductive layers, each mask including mask and etch regions, N being an integer equal to or larger than 2, O being an integer larger than 2, $2^{N-1} < O \leq 2^N$, m being a sequence number for the masks so that for one mask m=1, for another mask m=2, and so forth through m=N; and removing a portion of the conductive layers and the insulating layers, including: etching the conductive layers and the insulating layers in the contact region N times using the masks in a chosen order to create a plurality of etched depths extending from a surface layer to the conductive layers, each of the etched depths being extended to each of the corresponding landing areas; wherein when m=1, the corresponding etched depth equals to 1P layer or layers of the stacking structures; and when m=2, the corresponding etched depth equals to 2P layers of the stacking structures, P being an integer equal to or large than 1.

According to another aspect of the present disclosure, a 3D stacking semiconductor device is provided. The 3D stacking semiconductor device includes a plurality layers of stacking structures and a plurality of interlayer connectors. Each of the stacking structure includes a conductive layer and an insulating layer, and the conductive layers and the insulating layers are interlaced. The stacking structures form an array region, a contact region and a dummy region of the 3D stacking semiconductor device, and the dummy region is adjacent to the array region and the contact region and located on a same side of the array region and the contact region. The interlayer connectors are formed in the contact region, and each of the interlayer connectors is connected to each of the corresponding conductive layers.

The above and other aspects of the disclosure will become better understood with regard to the following detailed description of the non-limiting embodiment(s). The following description is made with reference to the accompanying drawings.

BRIEF DESCRIPTION OF THE DRAWINGS

Figure 1A:
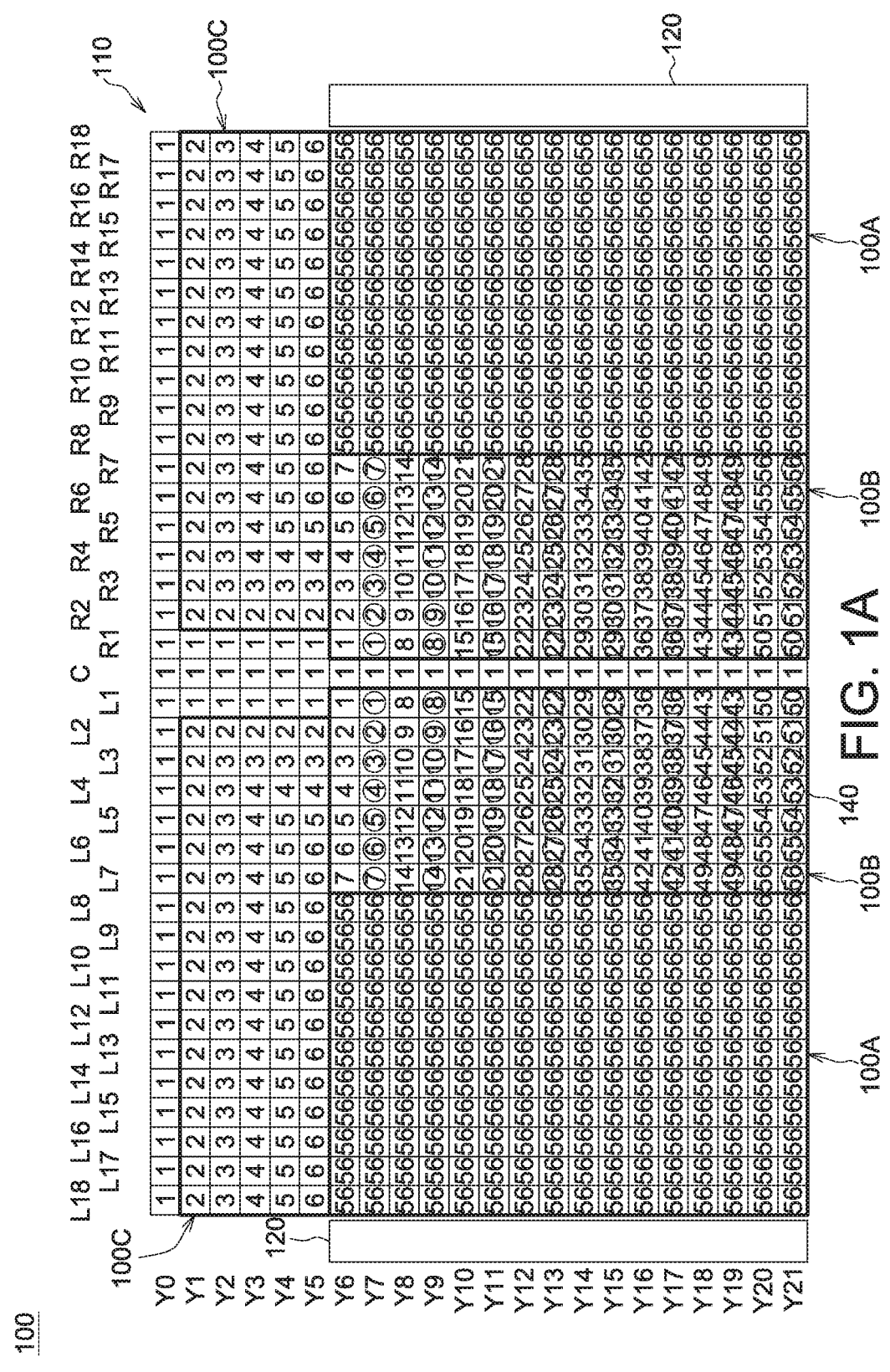

FIG. 1A shows a top view of a 3D stacking semiconductor device according to an embodiment;

FIGS. 5A-5B and 6A-6U show a flow chart of a manufacturing method of a 3D stacking semiconductor device according to an additional embodiment.

DETAILED DESCRIPTION

Figure 1B:
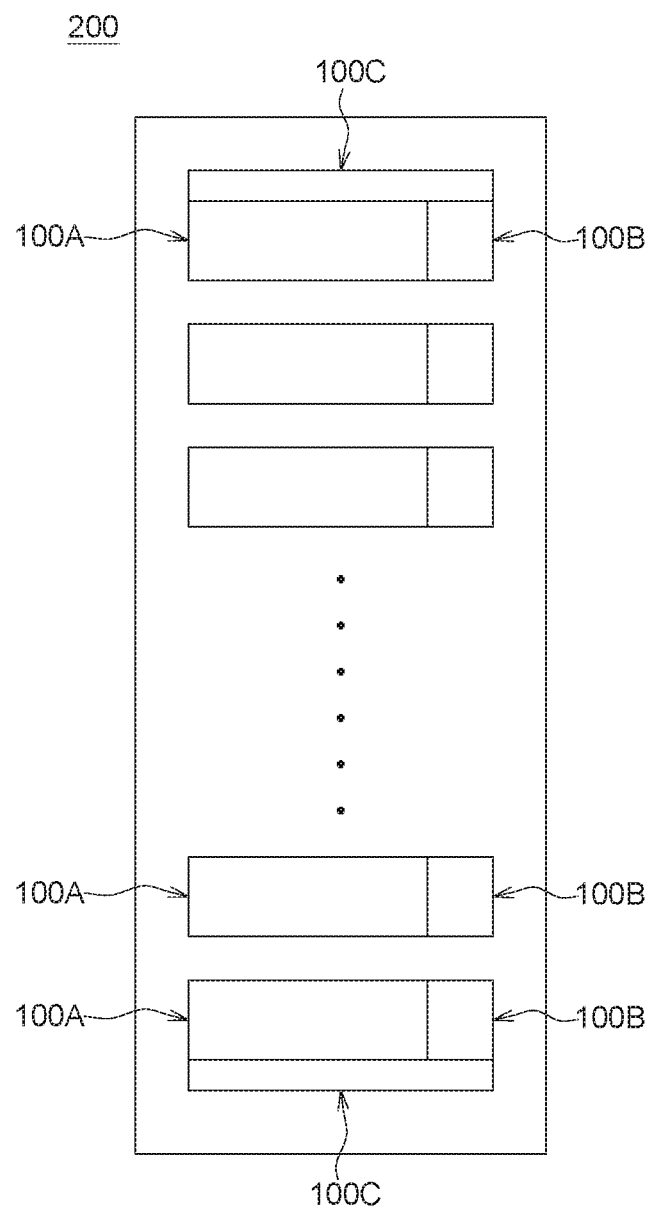
FIG. 1B shows a top view of a 3D stacking semiconductor device according to another embodiment.

Preferred embodiments are disclosed below for elaborating the invention. The following embodiments are for the purpose of elaboration only, not for limiting the scope of protection of the invention. Besides, secondary elements are omitted in the following embodiments to highlight the technical features of the invention.

FIG. 1A shows a top view of a 3D stacking semiconductor device according to an embodiment. As shown in FIG. 1A, the 3D stacking semiconductor device 100 includes a plurality layers of stacking structures 110 and a plurality of interlayer connectors 140. Each of the stacking structure 110 includes a conductive layer 111 and an insulating layer 112, and the conductive layers 111 and the insulating layers 112 are interlaced (referring to FIGS. 5A-5B). The stacking structures 110 form an array region 100A, a contact region 100B and a dummy region 100C of the 3D stacking semiconductor device 100, the dummy region 100O is adjacent to the array region 100A and the contact region 100B, and the dummy region 100O is located on a same side of the array region 100A and the contact region 100B.

In FIG. 1A, Y0-Y21 represent the coordinates along the Y direction, C represents the central point along the X direction, and L1-L18 and R1-R18 represent the coordinates extending from the central point C towards two sides along the X direction. Coordinates Y0-Y21 collocated with C, L1-L18 and R1-R18 can define a plurality of sub-regions of the 3D stacking semiconductor device. In FIG. 1A, the numbers labeled in the sub-regions represent the numbers of layers in the sub-regions, and the top surfaces of the sub-regions are all conductive layers 111 of the stacking structures 110. For example, all of the sub-regions in the array region 100A have 56 layers of the stacking structures 110, 56 numbers of layers (1 layer to 56 layers) are in the contact region 100B, and 5 numbers of layers (2 layers to 6 layers) are in the dummy region 100C. The drawings described hereinafter are all presented in the same manner as aforementioned.

As shown in FIG. 1A, the stacking structures 110 in the dummy region 1000 and in the contact region 100B have stair structures, and a number of stairs in the dummy region 1000 is smaller than a number of stairs in the contact region 100B. For example, as shown in FIG. 1A, the number of stairs in the dummy region 1000 is 5, and the number of stairs in the contact region 100E is 56.

In the embodiment, a height of stairs in the dummy region 1000 is smaller than or equal to a height of stairs in the contact region 100B. For example, as shown in FIG. 1A, the height of stairs in the dummy region 1000 is 6 layers of the stacking structures 110, and the height of stairs in the contact region 100E is 56 layers of the stacking structures 110.

As shown in FIG. 1A, a height difference is between the array region 100A and the contact region 100B, and the height difference decreases along the interface between the array region 100A and the contact region 100B towards a direction away from the dummy region 1000. For example, the height difference located most adjacent to the dummy region 1000 is 49 layers (56-7), and the height difference gradually decreases until it reaches 0 layer (56-56) at the located mostly away from the dummy region 1000.

In some embodiments, the height difference gradually decreases by units of P layer or layers of the stacking structures 110, and P is an integer equal to or larger than 1. For example, as shown in FIG. 1A, in the embodiment, the height difference decreases by units of 7 layers of the stacking structures, and it decreases gradually from 49 layers, 42 layers, 35 layers, 28 layers, 21 layers, 14 layers, 7 layers, to 0 layer.

As shown in FIG. 1A, the 3D stacking semiconductor device 100 further includes at least a word line decoder 120 connected to the array region 100A, and the word line decoder 120 and the dummy region 1000 are located on two adjacent sides of the array region 100A respectively.

FIG. 1B shows a top view of a 3D stacking semiconductor device according to another embodiment. The elements in the present embodiment sharing similar or the same labels with those in the previous embodiment are similar or the same elements, and the description of which is omitted.

As shown in FIG. 1B, in the 3D stacking semiconductor device 200, the stacking structures 110 may further include spaced apart stacking blocks, each of the stacking blocks has one of the array region 100A and at least one of the contact region 100B, and the 3D stacking semiconductor device 200 further has two of the dummy regions 100C located on two opposite sides of the stacking blocks respectively.

According to some embodiment, the present invention provides a manufacturing method of a 3D stacking semiconductor device. The method is for forming a plurality of interlayer connectors in the contact region of the 3D stacking semiconductor device, and each of the interlayer connectors is connected to each of the corresponding conductive layers. According to some embodiments, the method includes the following steps: using a set of N etch masks for creating O different numbers of removed layers in the conductive layers and the insulating layers in the contact region for forming a plurality of landing areas on the conductive layers in the contact region, the landing areas without overlying the conductive layers, each mask including mask and etch regions, N being an integer equal to or larger than 2, O being an integer larger than 2, $2^{N-1}<O \leq 2^N$, m being a sequence number for the masks so that for one mask m=1, for another mask m=2, and so forth through m=N; and removing a portion of the conductive layers and the insulating layers, including: etching the conductive layers and the insulating layers in the contact region N times using the masks in a chosen order to create a plurality of etched depths extending from a surface layer to the conductive layers, each of the etched depths being extended to each of the corresponding landing areas; wherein when m=1, the corresponding etched depth equals to 1P layer or layers of the stacking structures; and when m=2, the corresponding etched depth equals to 2P layers of the stacking structures, P being an integer equal to or larger than 1.

In some embodiments, when m=3, the corresponding etched depth equals to nP layers of the stacking structures, n being an integer equal to or larger than 3. In the embodiment, n includes an integer not equal to $2^{m-1}$, and $n \leq 2^{N-1}$.

The following embodiments are disclosed for illustrating the aforementioned manufacturing method of a 3D stacking semiconductor device.

FIGS. 2A-2E show a flow chart of a manufacturing method of a 3D stacking semiconductor device according to an embodiment. The elements in the present embodiment sharing similar or the same labels with those in the previous embodiment are similar or the same elements, and the description of which is omitted.

Figure 2A:
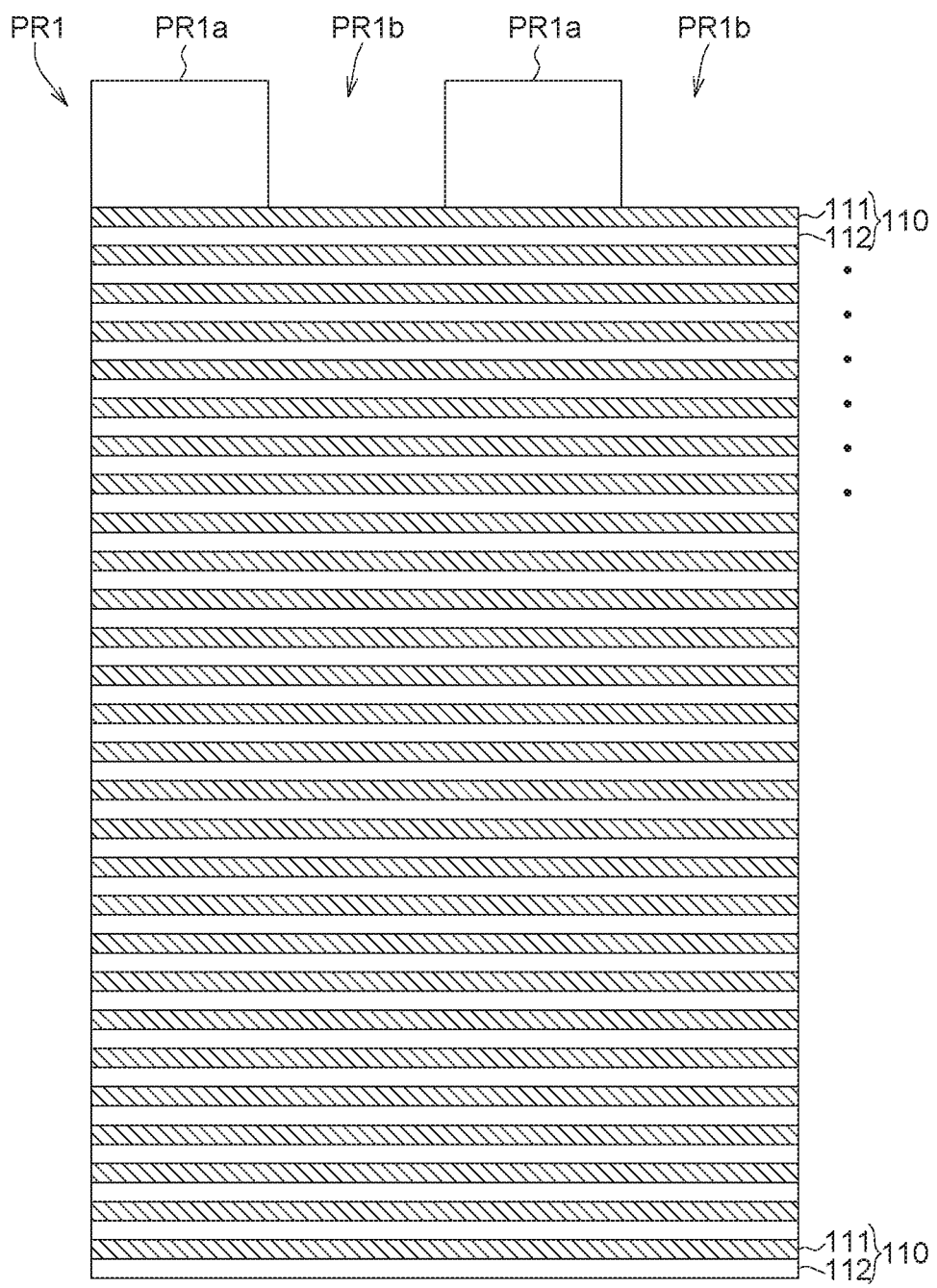
FIGS. 2A-2E show a flow chart of a manufacturing method of a 3D stacking semiconductor device according to an embodiment.

As shown in FIG. 2A, the stacking structures 110 are provided (FIG. 2A only shows the stacking structures 110 in the contact region). Each of the stacking structures 110 includes a conductive layer 111 and an insulating layer 112, and the conductive layers 111 and the insulating layers 112 are interlaced. At present, a first mask PR1 (m=1) is provided, and the mask PR1 includes mask regions PR1a and etch regions PR1b.

Figure 2B:
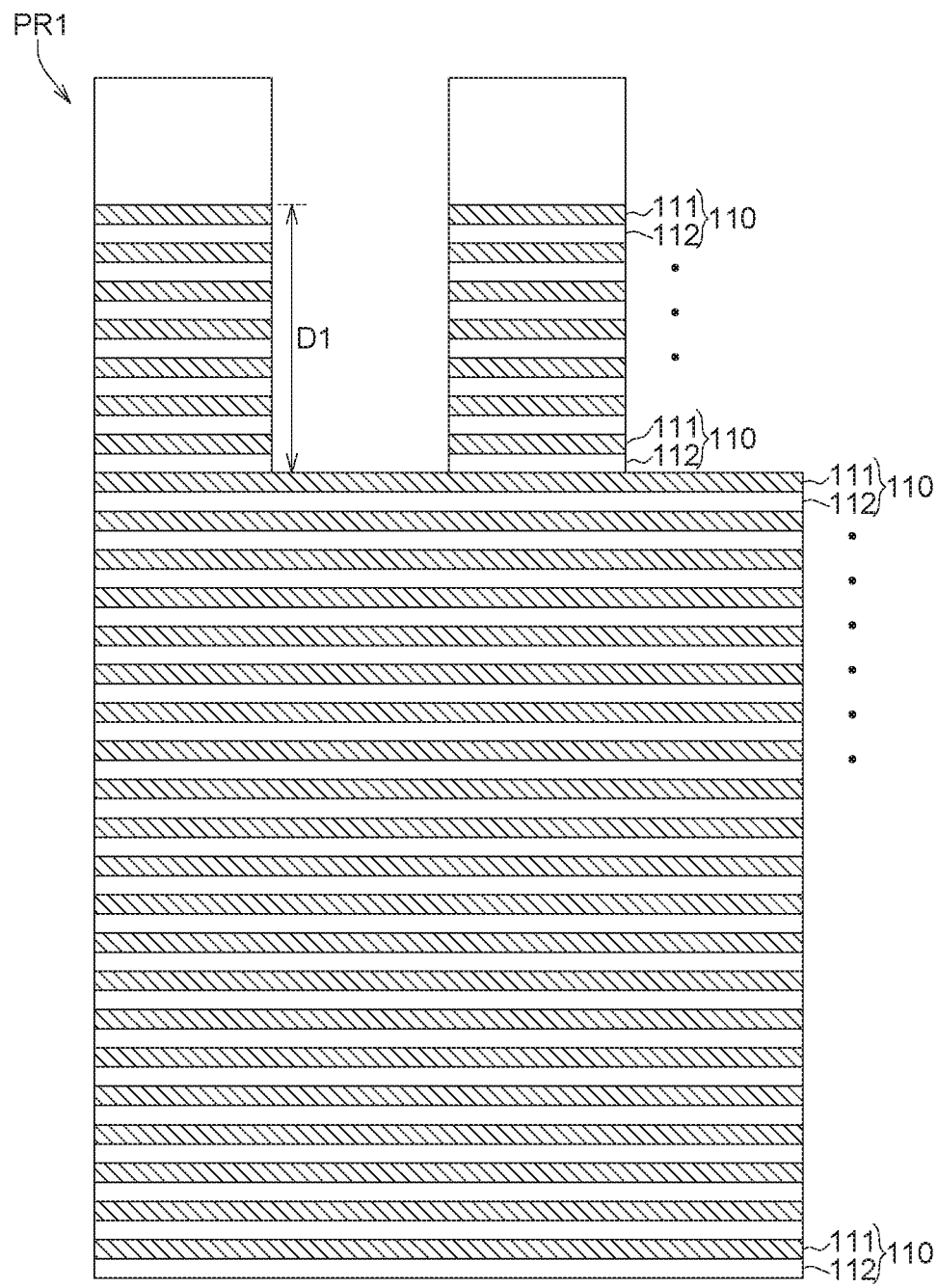

As shown in FIG. 2B, a portion of the conductive layers 111 and the insulating layers 112 in the contact region is removed. In this first etching step (N=1), the first mask PR1 is used to etch a portion of the conductive layers 111 and the insulating layers 112 to create an etched depth D1 extending from a surface layer to a conductive layer 111, and the etched depth D1 equals to 7 layers (P=7) of the stacking structures 110.

Figure 2C:
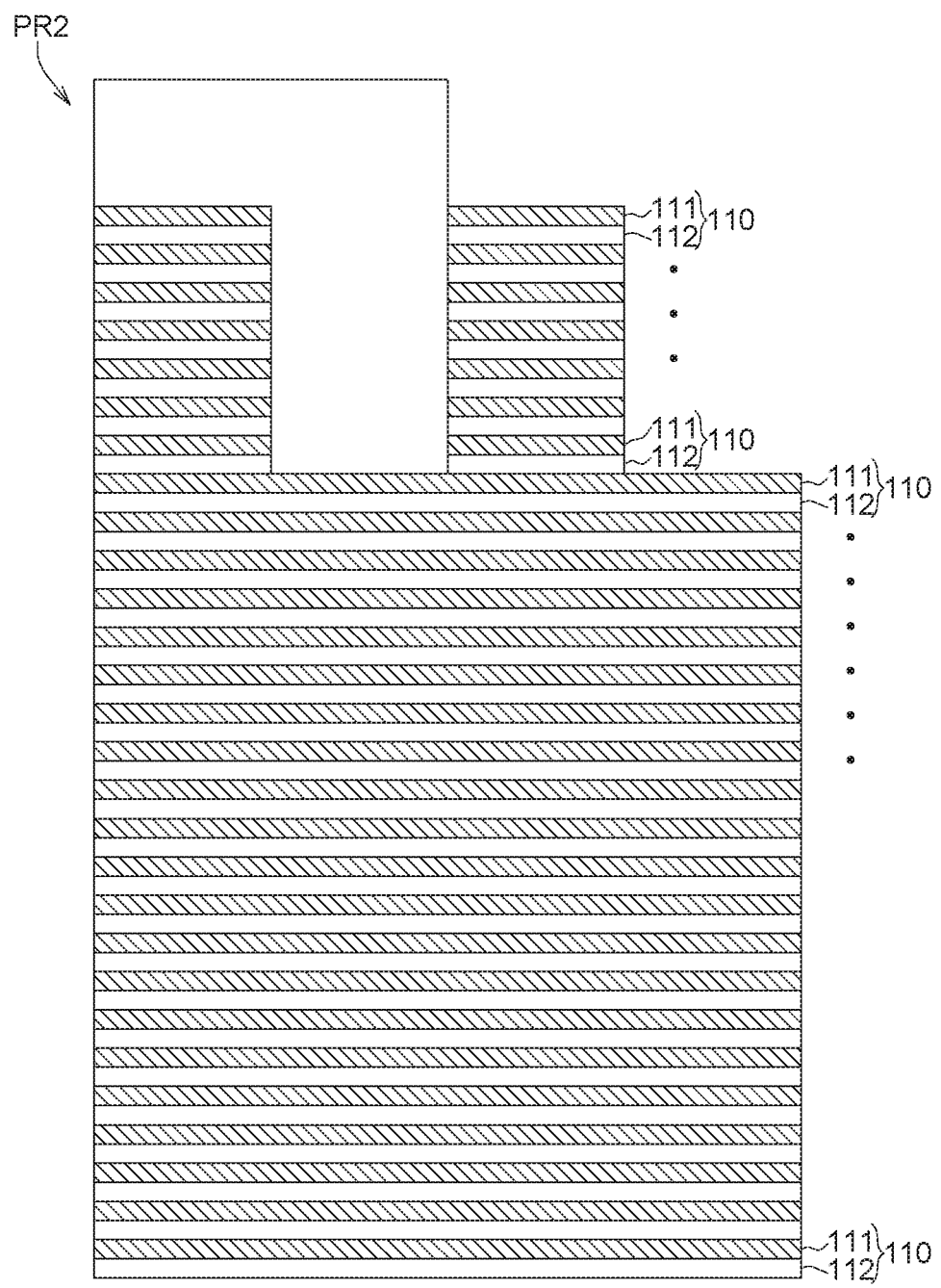
Figure 2D:
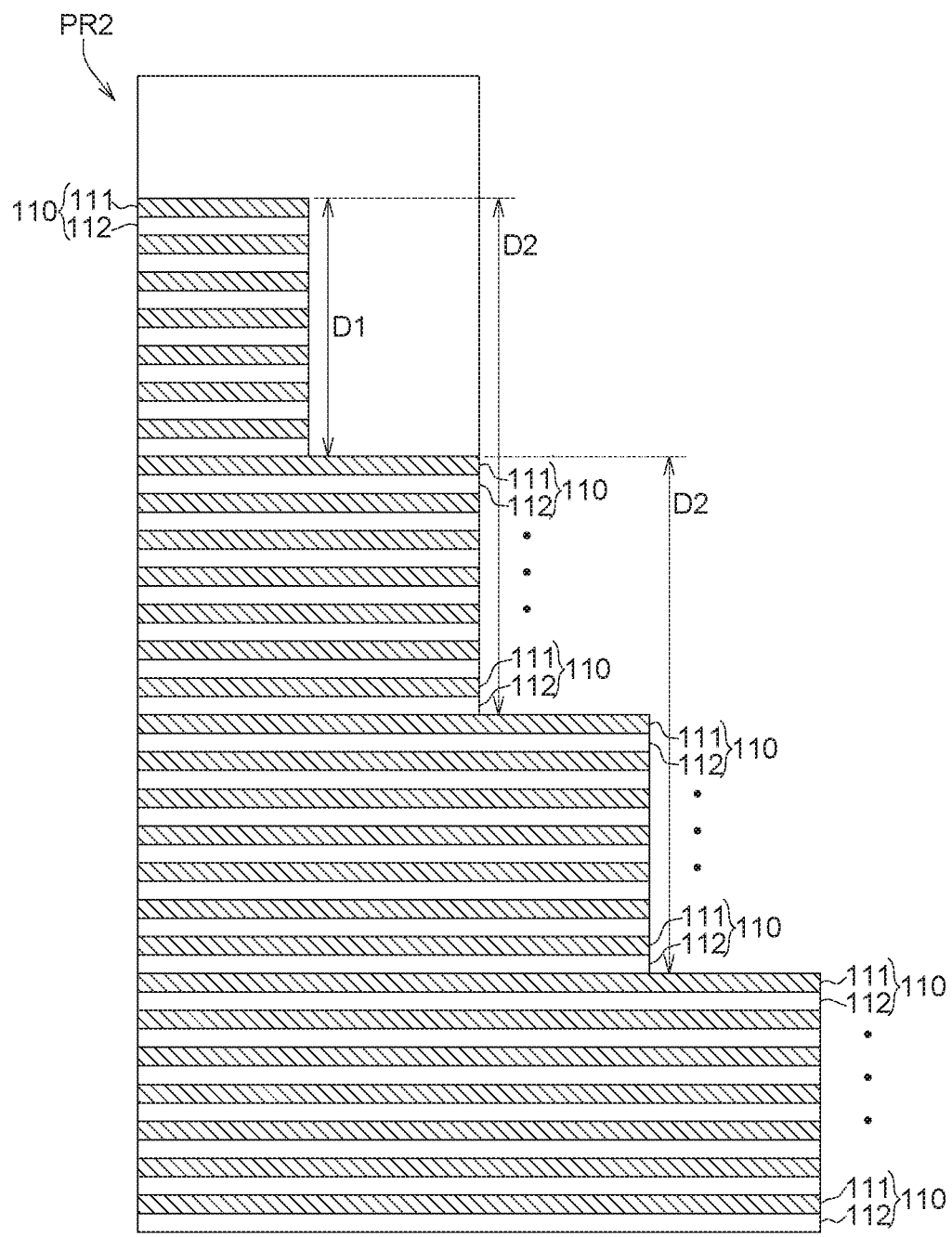

Next, as shown in FIGS. 2C-2D, the mask PR1 is removed. Then, in a second etching step (N=2), a second mask PR2 is used to etch a portion of the conductive layers 111 and the insulating layers 112 to create another etched depth D2 extending from a surface layer to a conductive layer 111, and the etched depth D2 equals to 14 layers (2P=14) of the stacking structures 110.

Figure 2E:
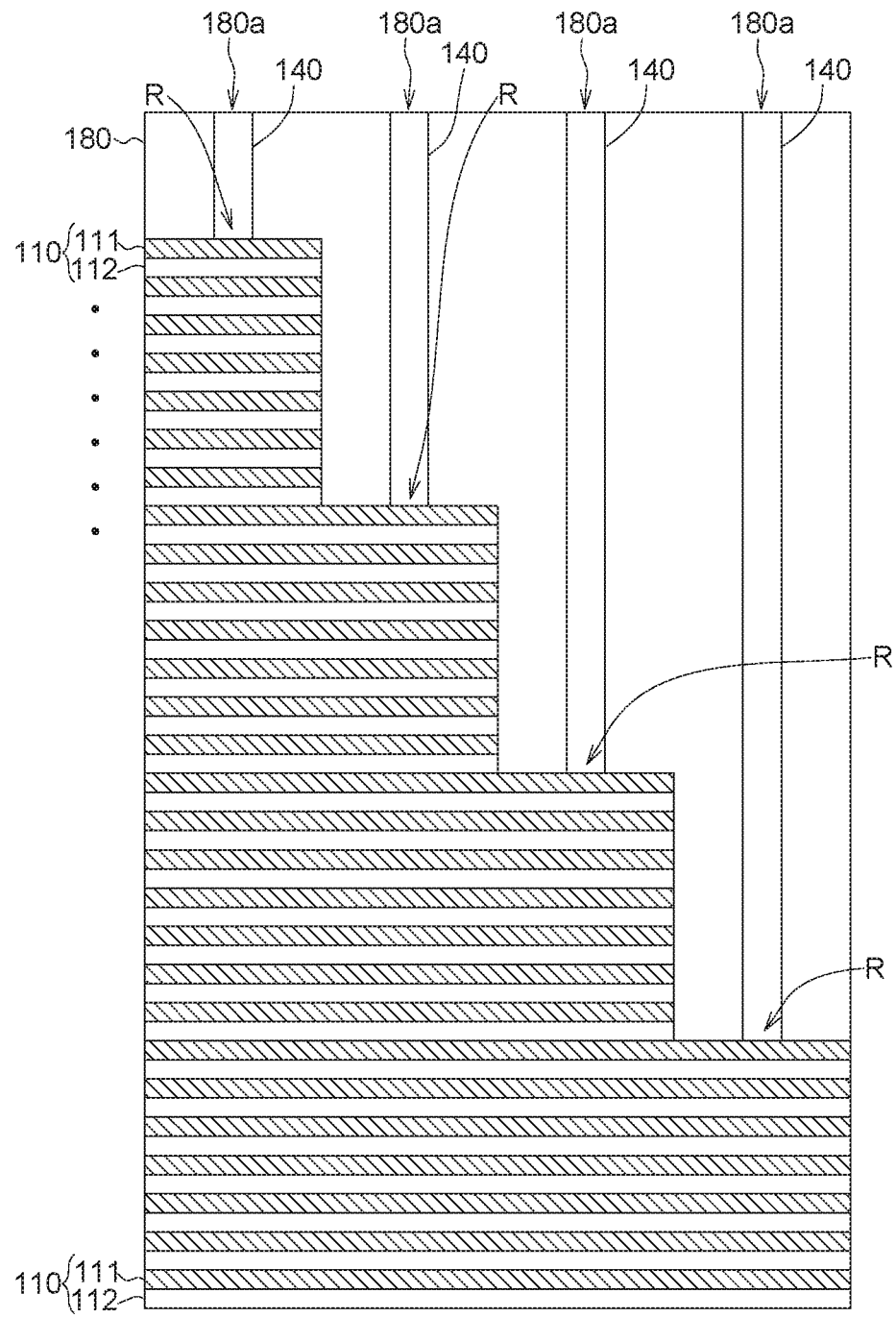

Next, as shown in FIG. 2E, a set of etch masks is used for creating different numbers of removed layers in the conductive layers 111 and the insulating layers 112 in the contact region, a plurality of landing areas R are formed on the conductive layers 111 in the contact region, the landing areas R are not overlying the conductive layers 111, and each of the etched depths is extended to each of the corresponding landing areas R.

As shown in FIG. 2E, next, a dielectric fill material 180 is formed on the landing areas R, and a plurality of contact openings 180a are formed penetrating through the dielectric fill material 180. Each of the contact openings 180a is connected to each of the corresponding landing areas R, and then a conductive material is filled within the contact openings 180a for forming the interlayer connectors 140.

The following further embodiments are disclosed for illustrating the manufacturing method of a 3D stacking semiconductor device. In the following embodiment, a set of 4 etch masks (N=4, m=1-4) is used to create 12 (O=12) different numbers of removed layers in the conductive layers and the insulating layers in the contact region, thereby 12 sub-regions having different numbers of layers of the stacking structures are formed. In table 1, "PR" indicates that a mask region is applied on said sub-region in said etch mask step, and "X" indicates that an etch region is applied on said sub-region in said etch mask step. "m=1" corresponds to an etched depth of 1 (P=1) layer of the stacking structures, "m=2" corresponds to an etched depth of 2 (P=1) layers of the stacking structures, "m=3" corresponds to an etched depth of 3 (n=3, P=1) layers of the stacking structures, and "m=4" corresponds to an etched depth of 6 (n=6, P=1) layers of the stacking structures.

TABLE 1

| Sub-region | Etched layers | m = 1 | m = 2 | m = 3 | m = 4 |
|---|---|---|---|---|---|
| 1 | 0 | PR | PR | PR | PR |
| 2 | 1 | X | PR | PR | PR |
| 3 | 2 | PR | X | PR | PR |
| 4 | 3 | PR | PR | X | PR |
| 5 | 4 | X | PR | X | PR |
| 6 | 5 | PR | X | X | PR |
| 7 | 6 | PR | PR | PR | X |
| 8 | 7 | X | PR | PR | X |
| 9 | 8 | PR | X | PR | X |
| 10 | 9 | PR | PR | X | X |
| 11 | 10 | X | PR | X | X |
| 12 | 11 | PR | X | X | X |

As shown in table 1, in some embodiments, when m is equal to or larger than 3, n may include an integer not equal to $2^{m-1}$ (e.g. 3 and 6), and $n<2^{N-1}$ (e.g. $3<2^3$ and $6<2^3$).

According to some embodiments, before a set of N etch masks is used for creating O different numbers of removed layers in the conductive layers 111 and the insulating layers 112 in the contact region, the 3D stacking semiconductor device 100 can be formed by a using a photoresist layer and a trimming process. For example, a photoresist layer may be provided, the photoresist layer covering part of the surface of the stacking structures in the array region and the contact region; next, the stacking structures are etched by using the photoresist layer as a mask, and a width of the photoresist layer is trimmed until the stacked structures in the contact region are exposed outside the trimmed photoresist layer, wherein the width of the photoresist layer is trimmed along a first direction in the contact region.

For example, in some embodiments, the photoresist layer may be used as the mask for etching M−1 times the stacking structures, and in each step of etching the stacking structures, the stacking structures are etched for a thickness of 1Q layer or layers, the width of the photoresist layer is trimmed one time after each of the 1 to M−2 steps of etching the stacking structures, M is an integer equal to or larger than 3, and Q is an integer equal to or larger than 1.

The following embodiments are disclosed for illustrating the aforementioned manufacturing method of a 3D stacking semiconductor device.

FIGS. 3A-3F show a flow chart of a manufacturing method of a 3D stacking semiconductor device according to another embodiment. The elements in the present embodiment sharing similar or the same labels with those in the previous embodiment are similar or the same elements, and the description of which is omitted.

Figure 3A:
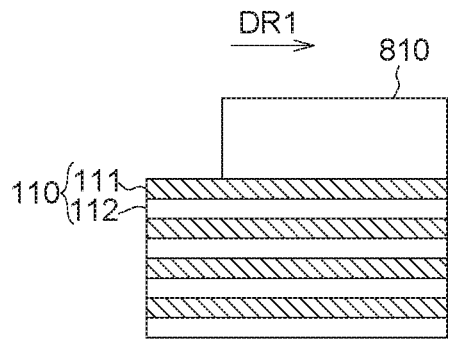
FIGS. 3A-3F show a flow chart of a manufacturing method of a 3D stacking semiconductor device according to another embodiment.

As shown in FIG. 3A, the stacking structures 110 are provided. At this time, 4 layers of stacking structures 110 are not etched. 4 layers of conductive layer 111 and 4 layers of insulating layer 112 are interlaced and stacked compactly.

In FIG. 3A, the photoresist layer 810 is provided. The photoresist layer 810 covers part of the surface of the 4 layers of stacking structure 110.

Figure 3B:
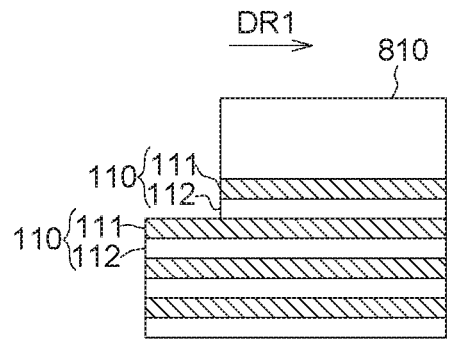

In FIG. 3B, the stacking structures 110 are etched by using the photoresist layer 810 as a mask. In this step of etching the stacking structures 110, the exposed portion of the stacking structures 110 is etched for a thickness of one layer (Q=1).

Figure 3C:
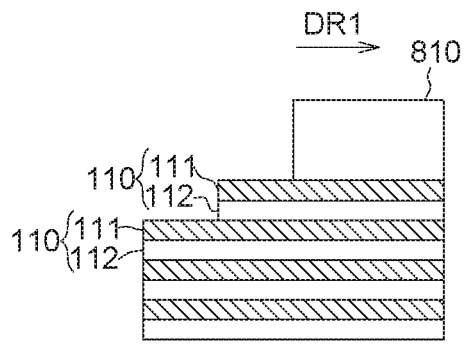

In FIG. 3C, the photoresist layer 810 is trimmed for a width along a first direction DR1, such that two layers of the stacking structures 110 are exposed.

Figure 3D:
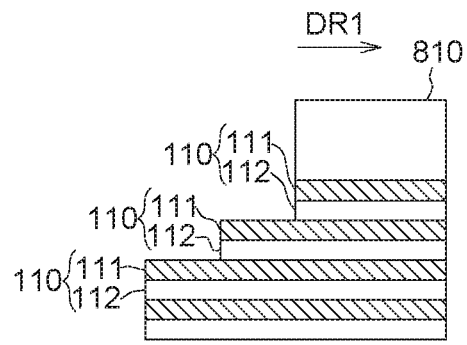

In FIG. 3D, the stacking structures 110 are etched by using the trimmed photoresist layer 810 as a mask. In this step of etching the stacking structure, the exposed portion of the stacking structures 110 is etched for a thickness of one layer. That is to say, part of the first layer and the second layer of the stacking structures 110 are etched for a thickness of one layer.

Figure 3E:
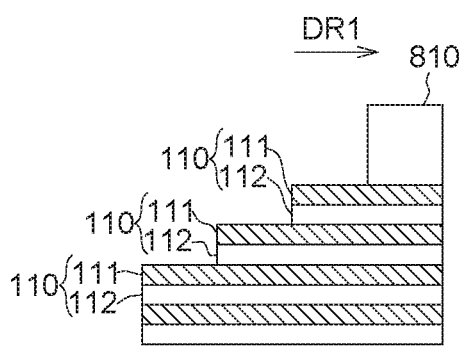
Figure 3F:
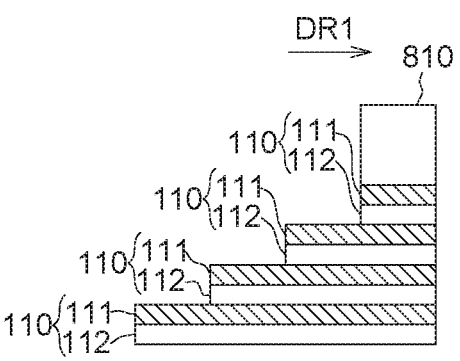

In FIGS. 3E-3F, the steps of trimming the photoresist layer 810 and etching the stacking structures 110 as shown in FIGS. 3C-3D are repeated, and then the photoresist layer 810 is removed to form 4 stages.

In FIGS. 3A to 3F, the stacking structures 110 are etched 3 times (i.e. M−1 times). In each step of etching, the stacking structures 110 are etched for a thickness of one layer, and the width of the photoresist layer 810 is trimmed one time after each of the first to second (i.e. M−2 times) steps of etching the stacking structures 110. In the present embodiment, M equals to 4, and Q equals to 1.

FIGS. 4A-4D show the change of a photoresist layer during etch and trimming. The elements in the present embodiment sharing similar or the same labels with those in the previous embodiment are similar or the same elements, and the description of which is omitted.

Figure 4A:
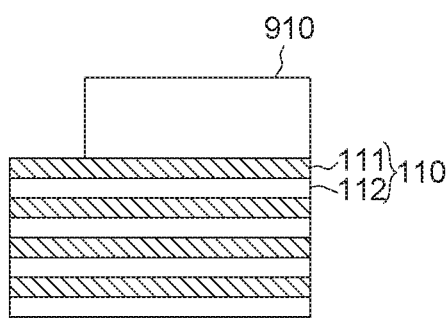
FIGS. 4A-4D show the change of a photoresist layer during etch and trimming.
Figure 4B:
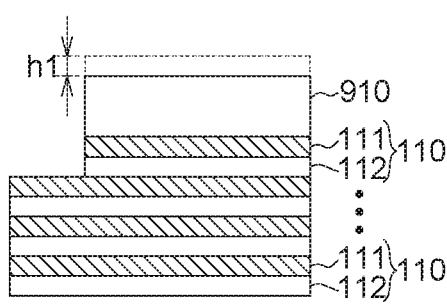

As shown in FIGS. 4A-4B, the photoresist layer 910 will be consumed for a thickness h1, such as about 500 Å, during the process of etching the stacking structure 110. As shown in FIGS. 4B-4O, the photoresist layer 910 will be consumed for a thickness t1, such as about 4000 Å, during the process of trimming the photoresist layer 910 for a width tx. Thus, the consumption of the photoresist layer 910 is needed to be controlled during the steps of etching or the steps of trimming.

Figure 4D:
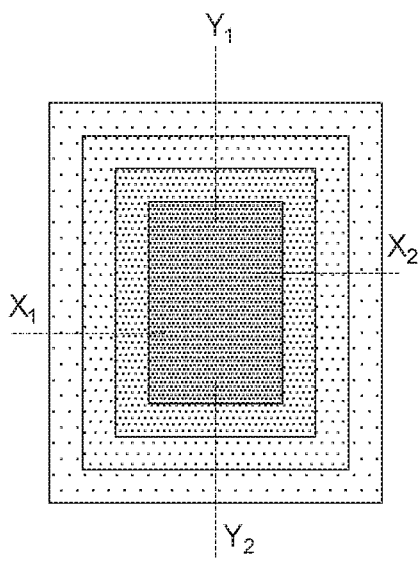
Figure 4C:
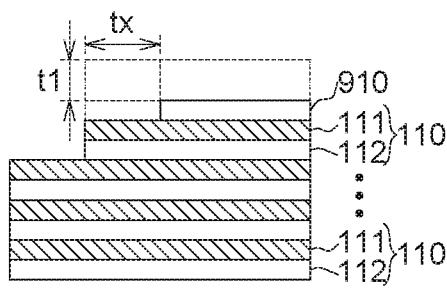

In addition, since the etching process for trimming the photoresist layer 910 is isotropic, such that the consumed width is at least bi-directional. As shown in FIG. 4D, even a stair structure is predetermined to be formed on the $X_1$ direction, stair structures will also be formed on $X_2$, $Y_1$ and $Y_2$ directions.

FIGS. 5A-5B and 6A-6U show a flow chart of a manufacturing method of a 3D stacking semiconductor device according to an additional embodiment. The elements in the present embodiment sharing similar or the same labels with those in the previous embodiment are similar or the same elements, and the description of which is omitted.

Figure 5A:
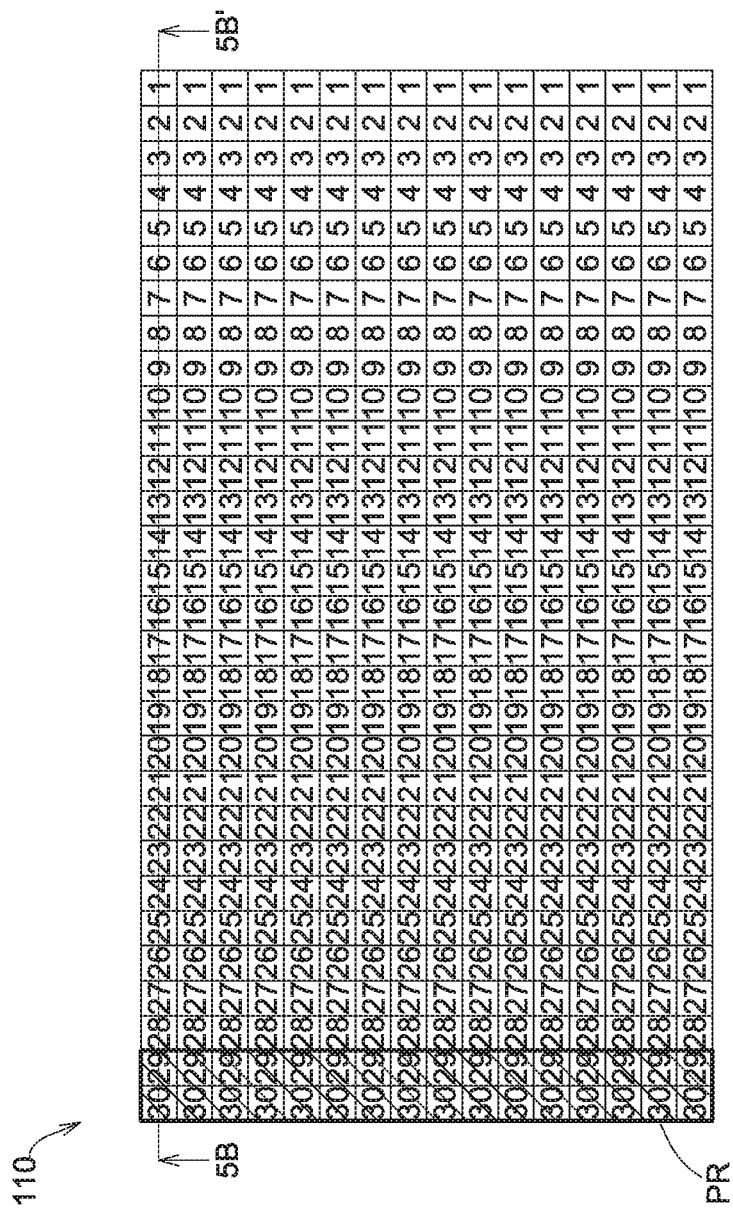
Figure 5B:
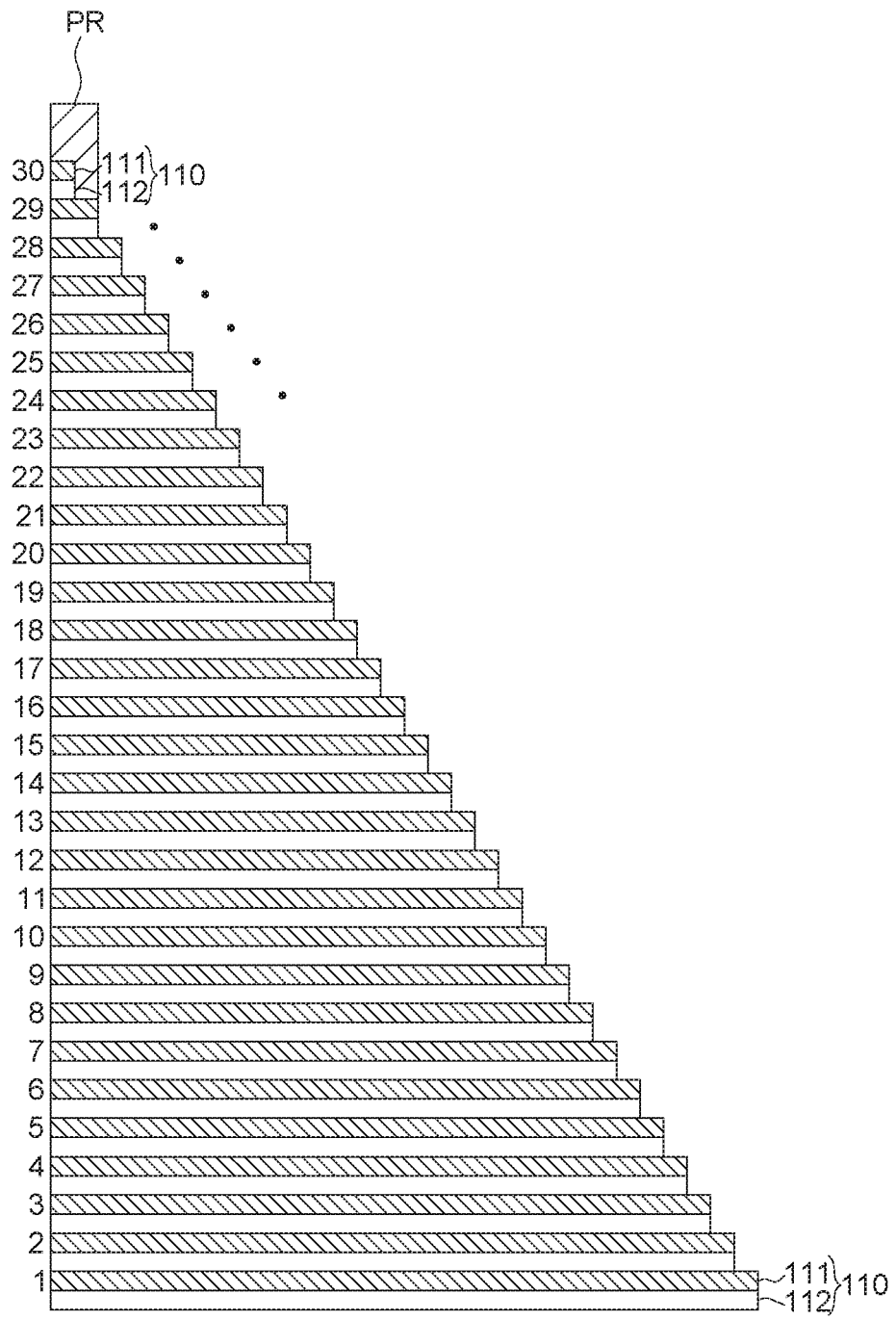

FIGS. 5A-5B are for showing the cross-sectional features of the top views as shown in the following FIGS. 6A-6U. FIG. 5A is a top view of stacking structures, and FIG. 5B is a cross-sectional view along the cross-sectional line 5B-5B' in FIG. 5A. In FIG. 5A, the numbers labeled in the sub-regions represent the numbers of layers of stacking structures 110 in the sub-regions, and the top surfaces of the sub-regions are all conductive layers 111 of the stacking structures 110. Moreover, as shown in FIGS. 5A-5B, the mask PR covers part of the surface of the stacking structures 110 (one the sub-regions having 30 layers and 29 layers of stacking structures 110). In addition, as shown in FIG. 5B, the number of layers of stacking structures 110 gradually decrease from the left-side to the right-side forming a stair structure.

Figure 6A:
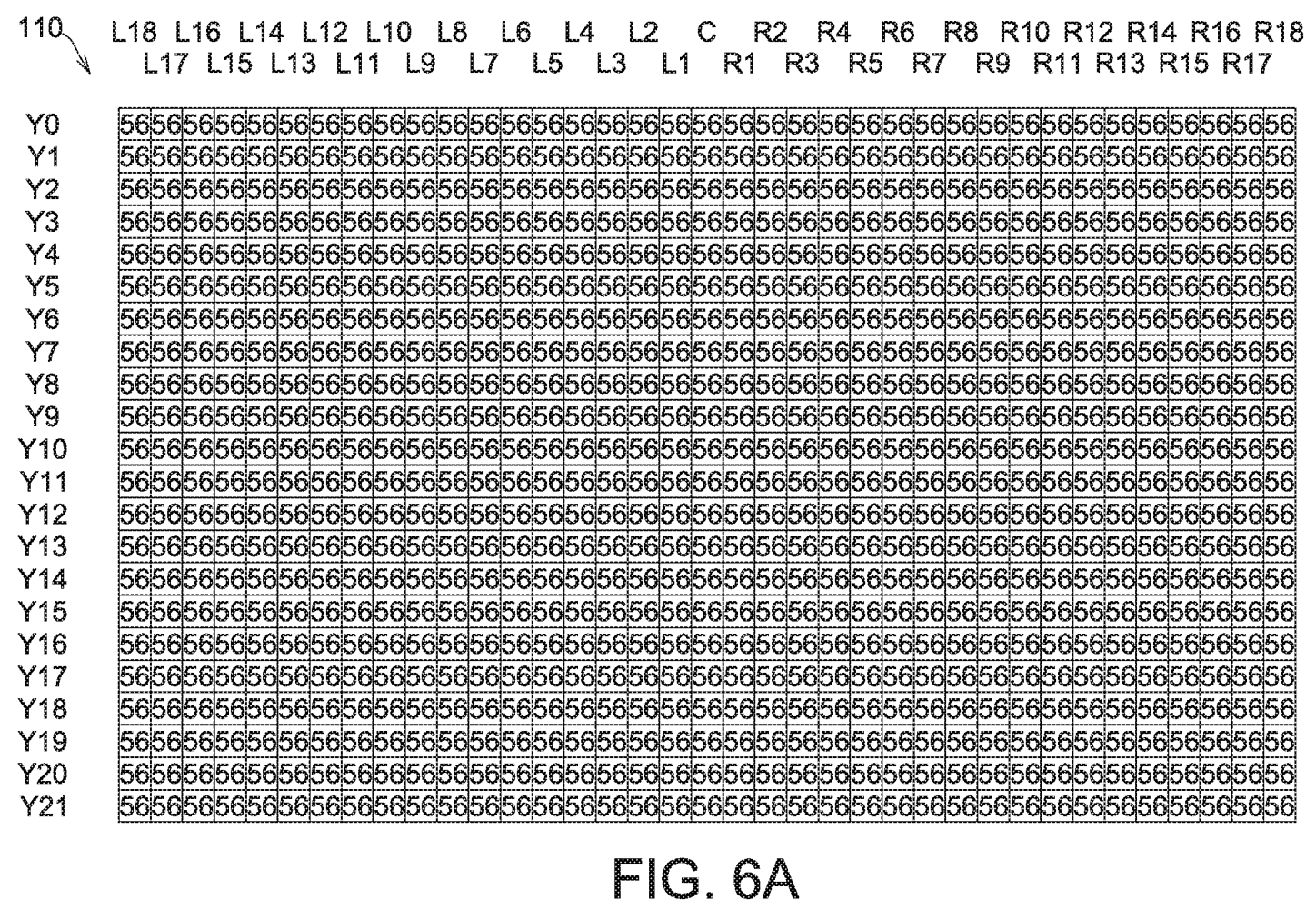

As shown in FIG. 6A, the stacking structures 110 are provided. At this time, 56 layers of stacking structures 110 are not etched.

Figure 6B:
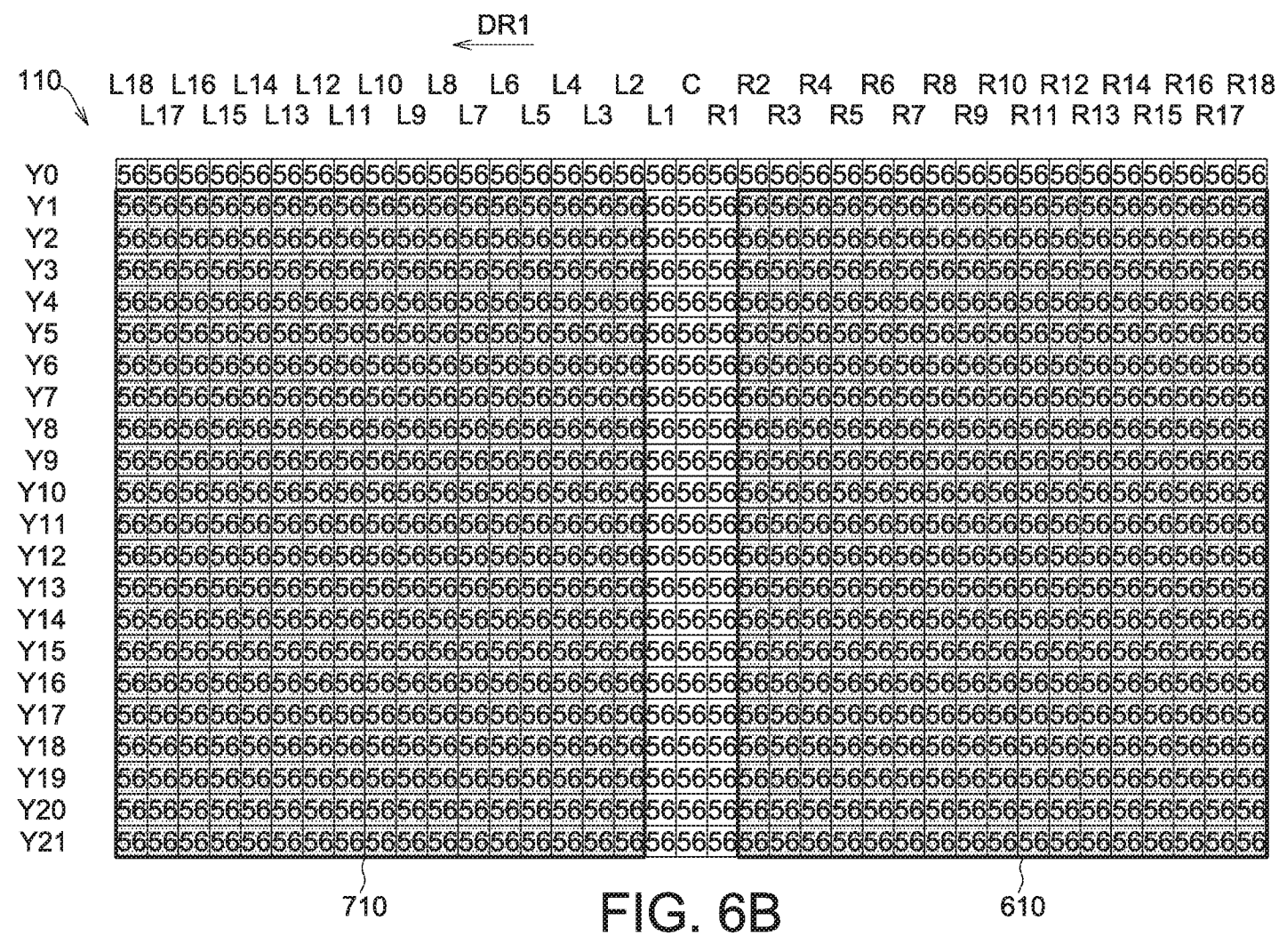

As shown in FIG. 6B, the photoresist layer 710 is provided. The photoresist layer 710 covers part of the surface of the 56 layers of stacking structures 110.

In some embodiments, as shown in FIG. 6B, another photoresist layer 610 may be disposed on part of the surface of the stacking structure 110. The photoresist layer 610 and the photoresist layer 710 are mirror symmetric with respect to the central point (C).

Figure 6C:
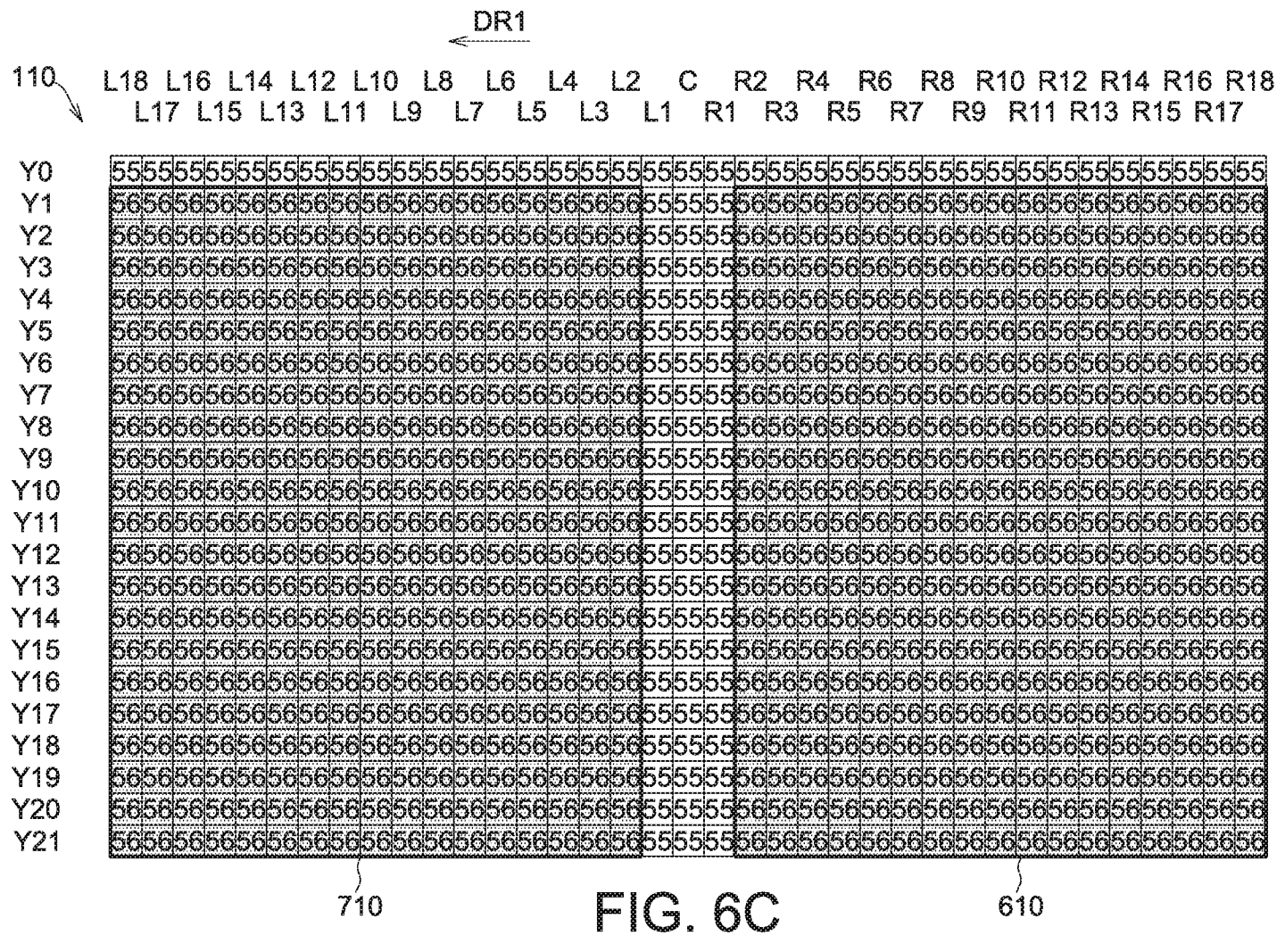

As shown in FIG. 6C, the stacking structures 110 are etched by using the photoresist layer 710 as a mask. In this step of etching the stacking structures 110, the exposed portion of the stacking structures 110 is etched for a thickness of one layer (Q=1). That is, 55 layers of stacking structures 110 are left. In some embodiments, as shown in FIG. 6C, the stacking structures 110 are also etched by using the photoresist layer 610 as a mask for a thickness of one layer.

Figure 6D:
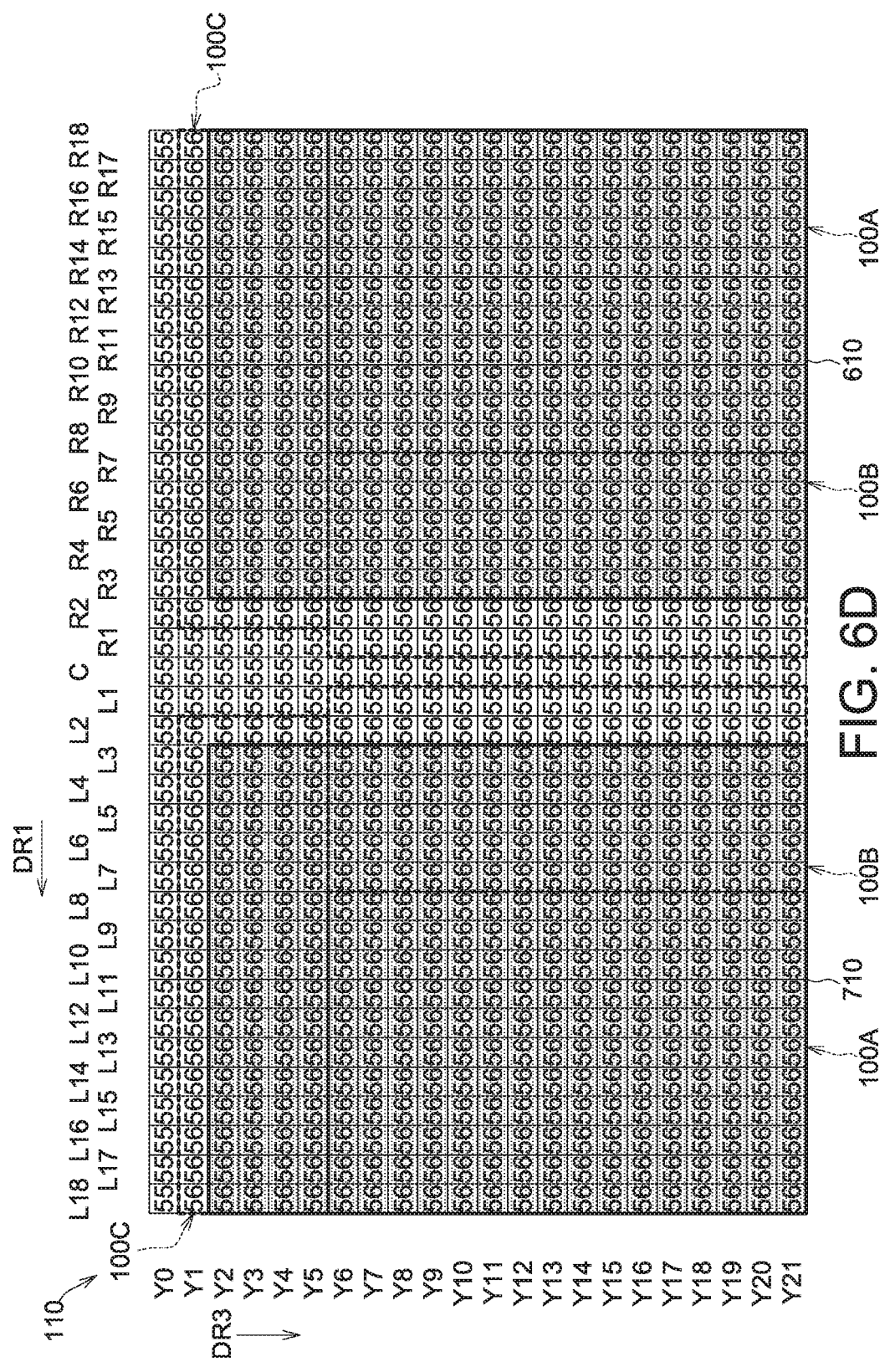

As shown in FIG. 6D, the photoresist layer 710 is trimmed for a width for exposing two layers of the stacking structures 110. In the embodiment, the width of the photoresist layer 710 is trimmed along the first direction DR1 in the predetermined contact region 100B, the width of the photoresist layer 710 is trimmed along the third direction DR3 in the predetermined dummy region 1000, and the third direction DR3 is different from the first direction DR1. In some embodiments, in the step of trimming the width of the photoresist layer 710, the width of the photoresist layer 610 is also trimmed, and the width of the photoresist layer 610 is trimmed along a direction opposite to the first direction DR1.

Figure 6E:
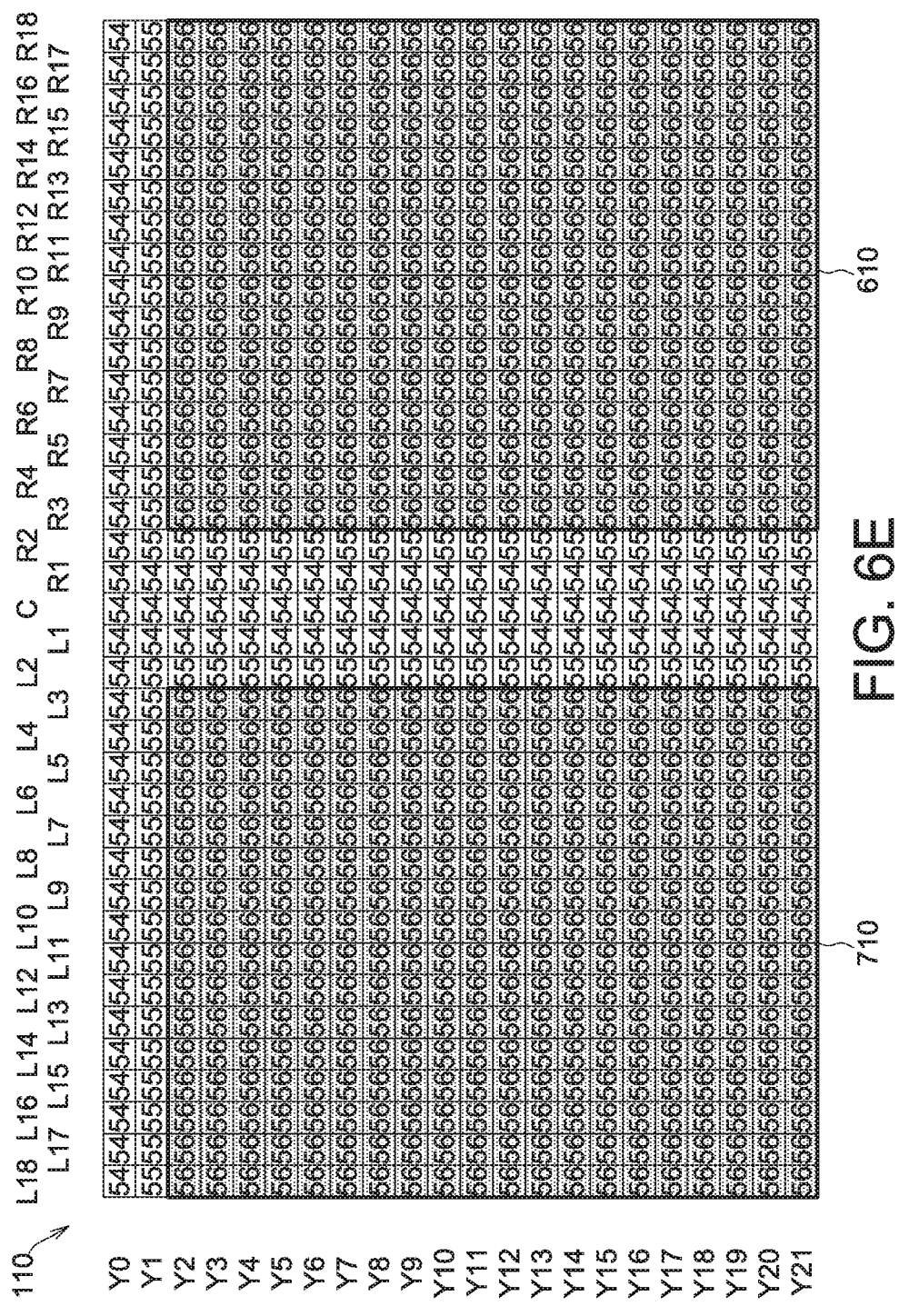
Figure 6F:
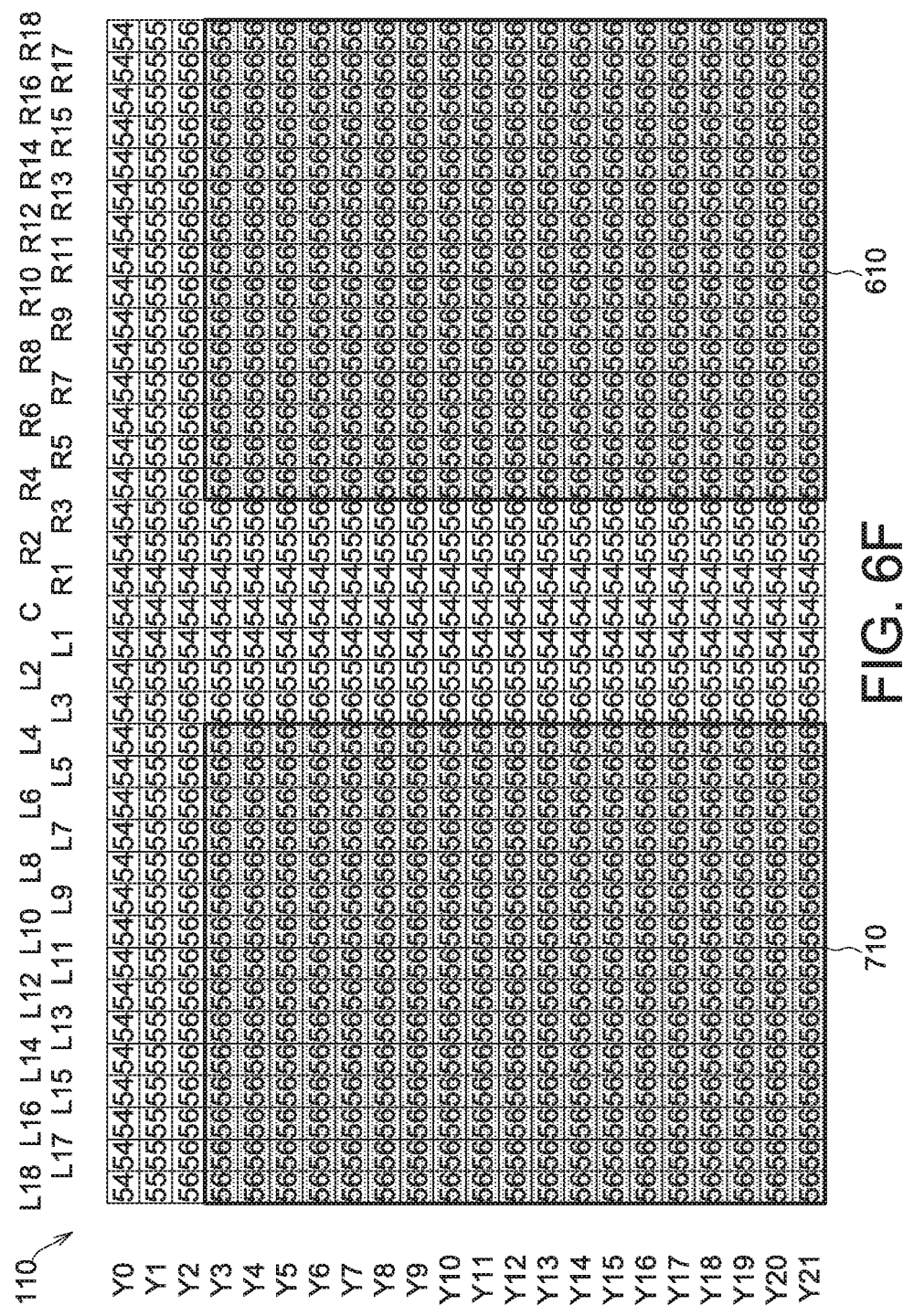
Figure 6G:
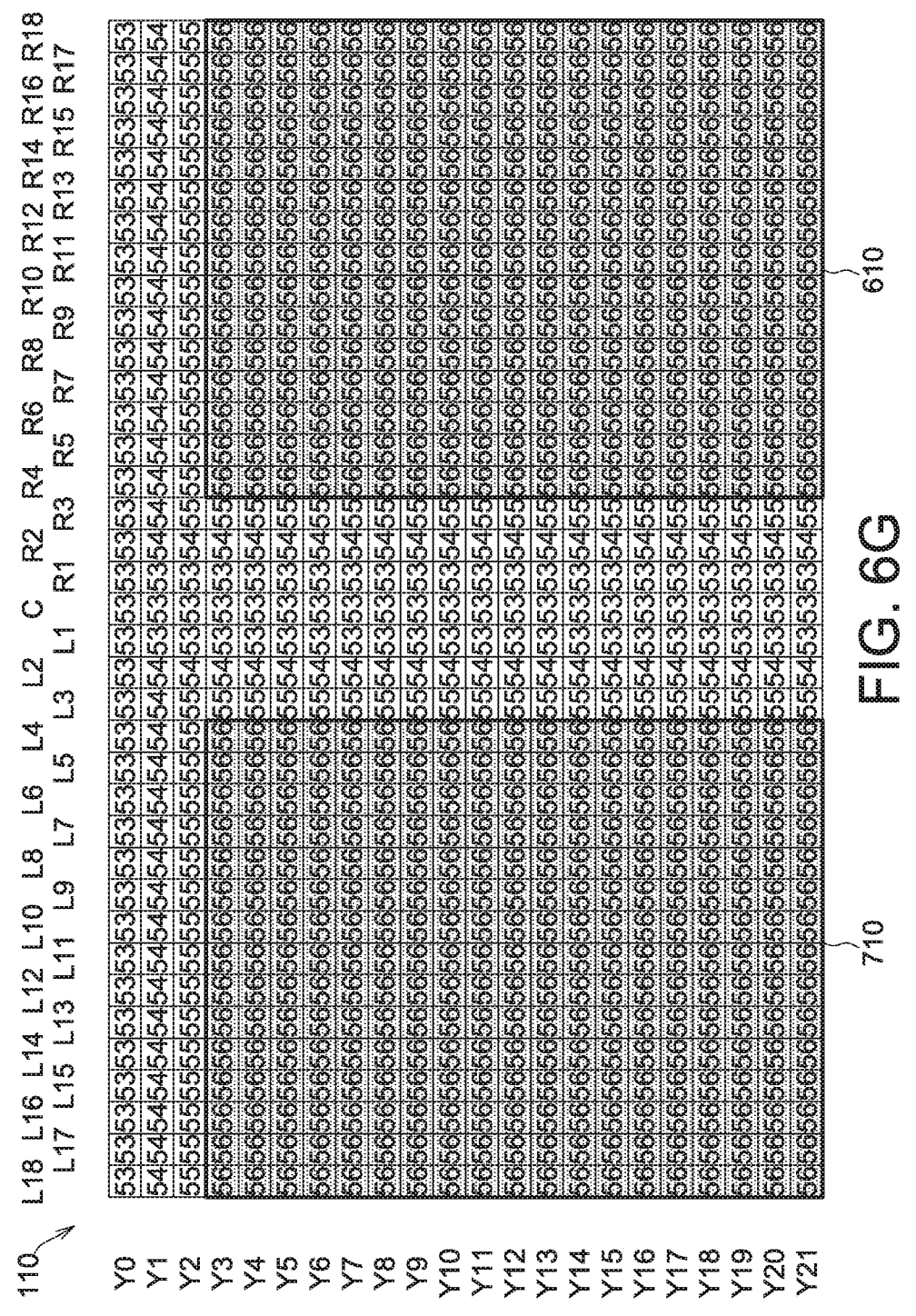
Figure 6H:
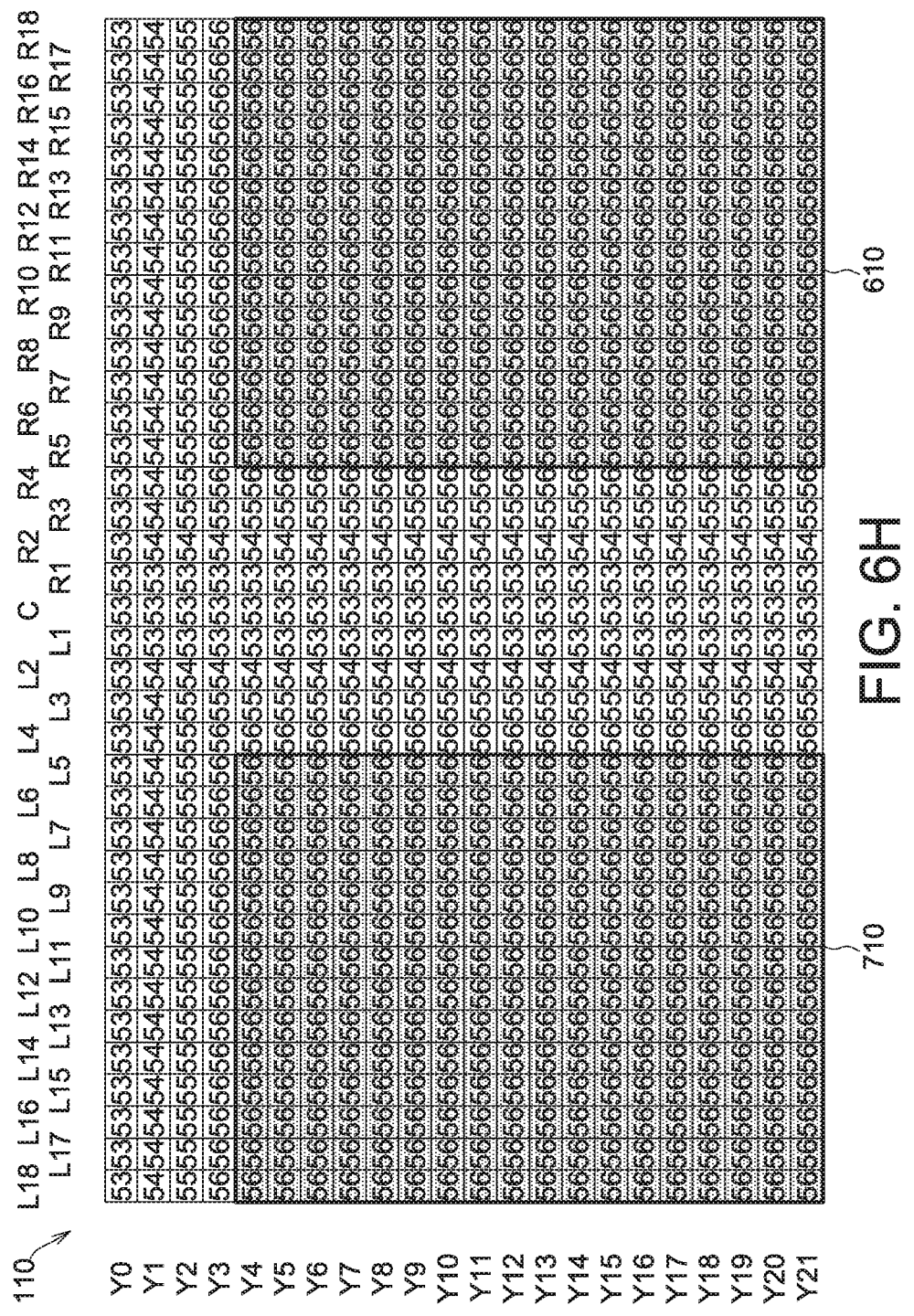
Figure 6J:
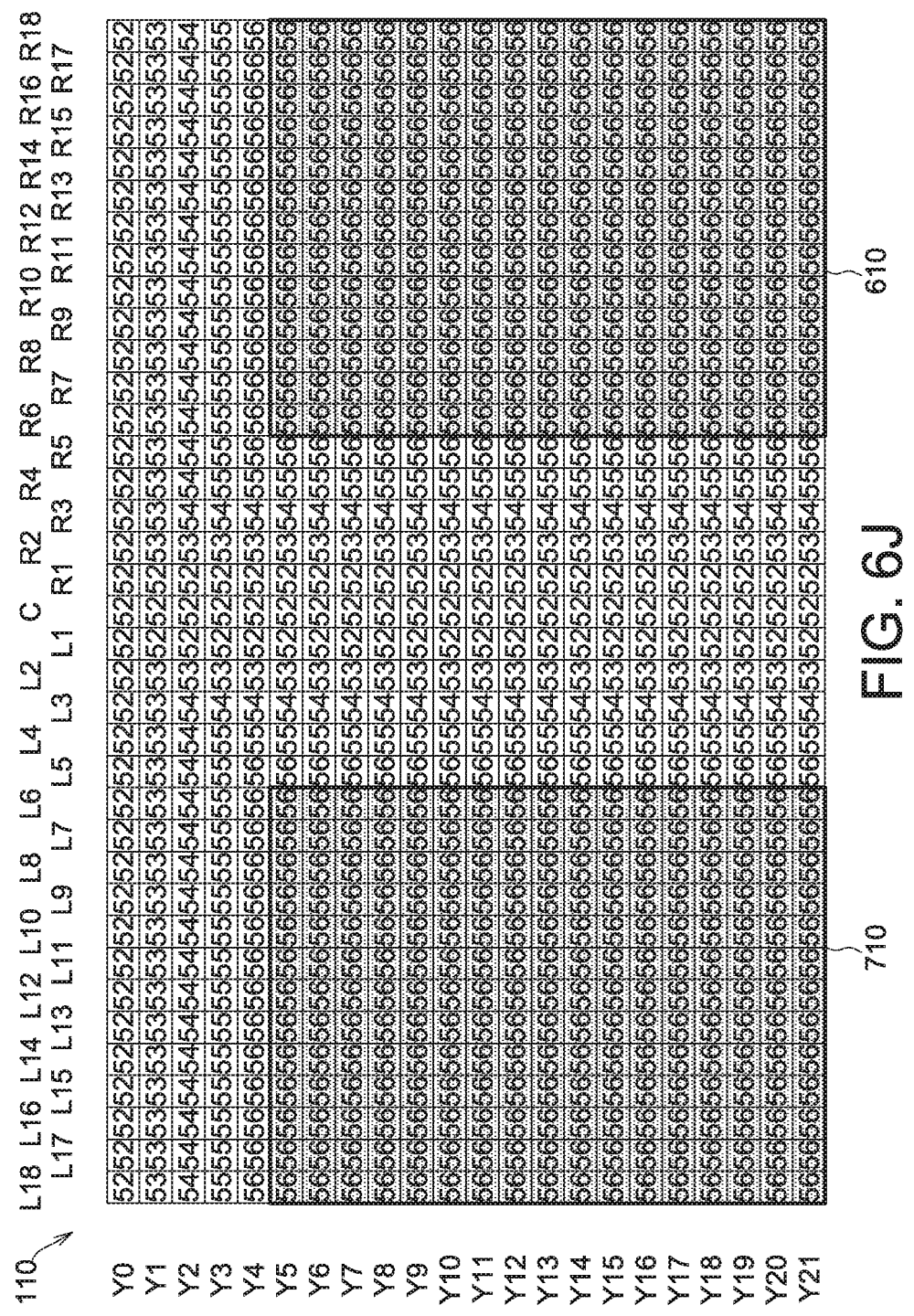
Figure 6K:
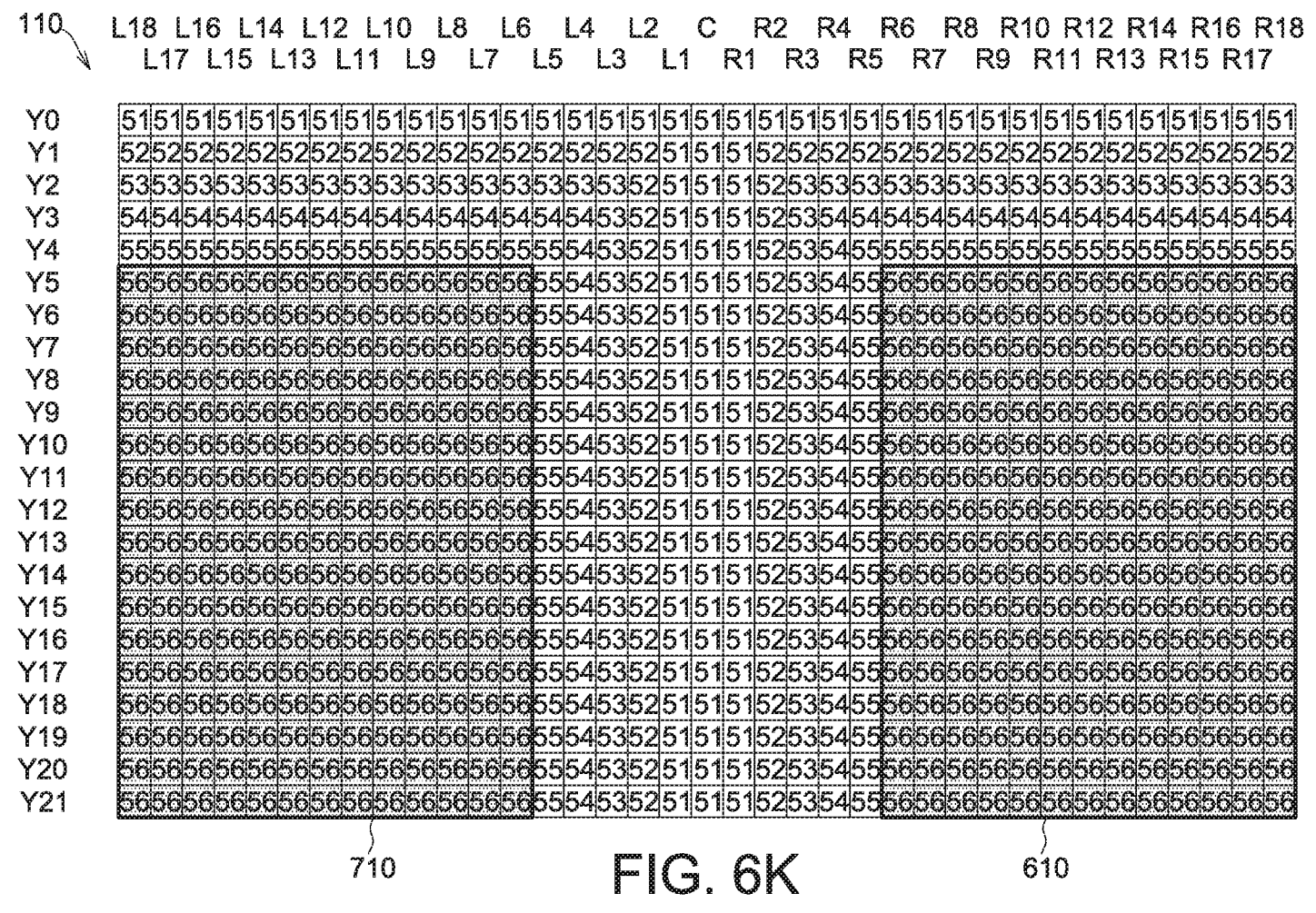
Figure 6L:
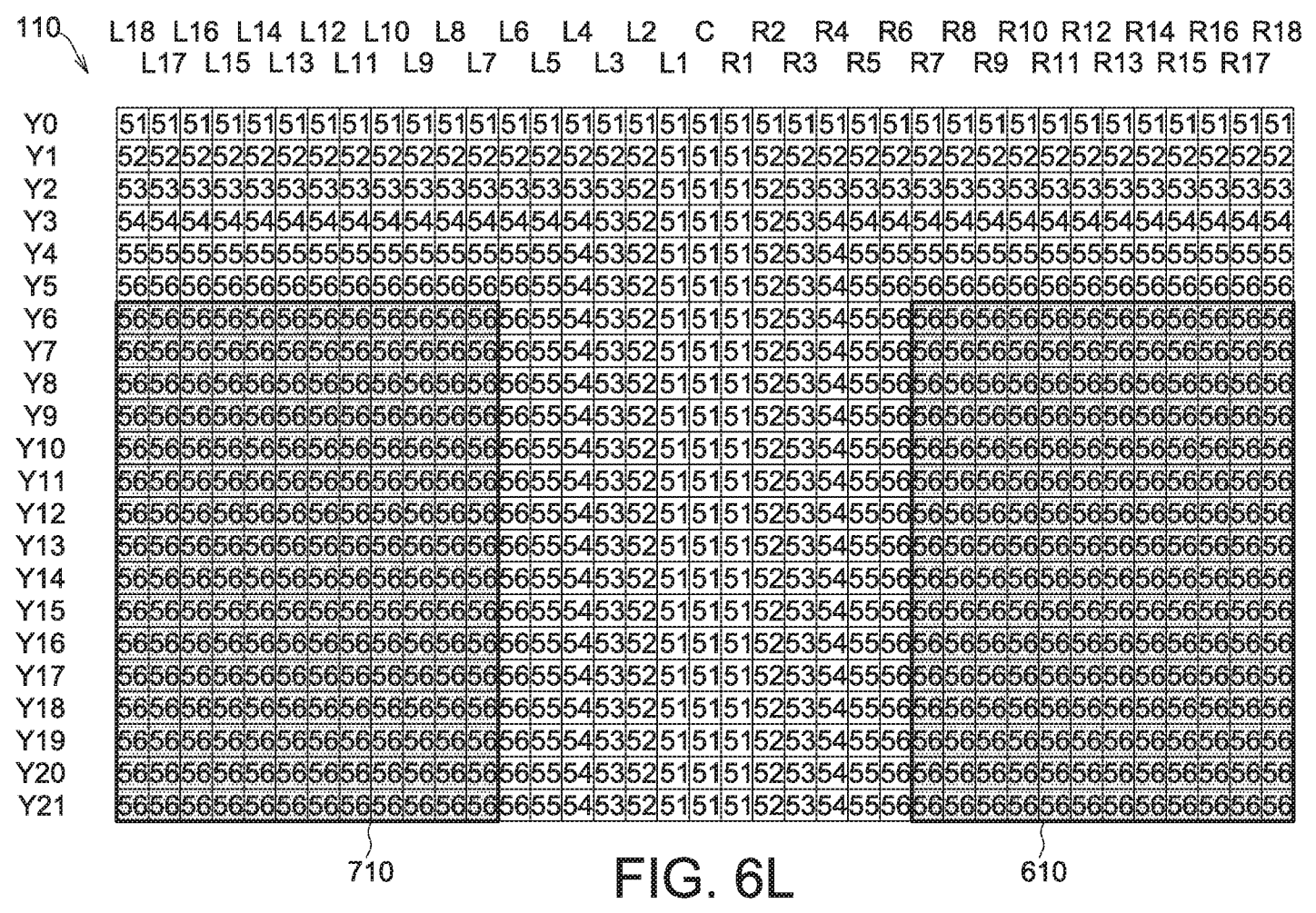

As show in FIG. 6E, the stacking structures 110 are etched by using the trimmed photoresist layer 710 as a mask. In this step of etching the stacking structure, the exposed portion of the stacking structures 110 is etched for a thickness of one layer. That is to say, part of the first layer and the second layer (i.e. the portions originally having 56 layers and 55 layers) of the stacking structures 110 are etched for a thickness of one layer.

In some embodiments, referring to the top view as shown in FIG. 6E, the stacking structures 110 are also etched by using the trimmed photoresist layer 610 as a mask for a thickness of one layer.

Figure 6M:
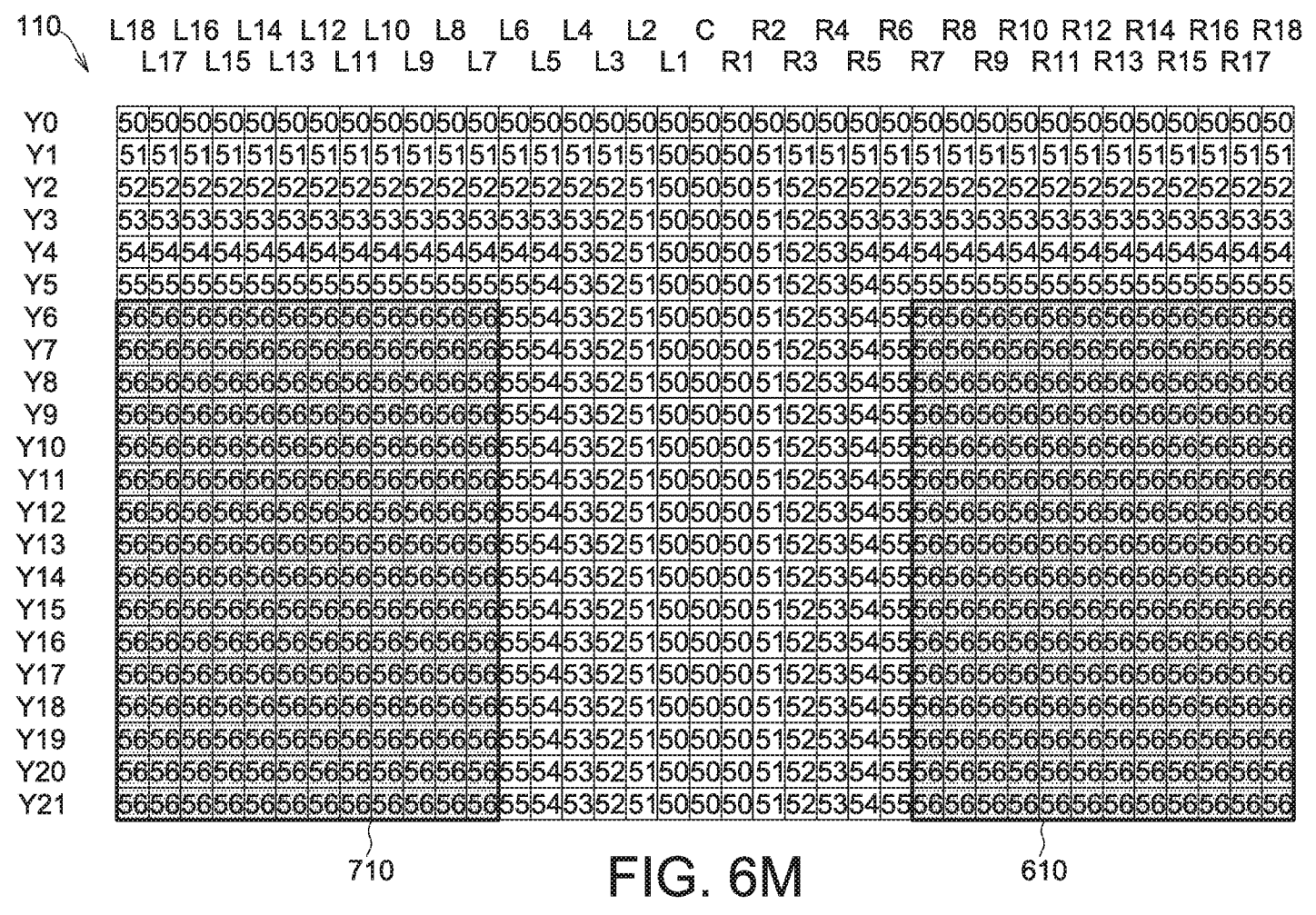

In FIGS. 6F-6M, the steps of trimming the photoresist layer 710 and etching the stacking structures 110 as shown in FIGS. 6D-6E are repeated, and 7 stages are formed. As shown in FIG. 6M, the steps of trimming the photoresist layer 710 and etching the stacking structures 110 are repeated until the stacking structures 110 in the contact region 100B and the stacking structures 110 in the dummy region 1000 are exposed outside the trimmed photoresist layer 710.

In FIGS. 6A to 6M, the stacking structures 110 are etched 6 times (i.e. M−1 times). In each step of etching, the stacking structures 110 are etched for a thickness of one layer, and the width of the photoresist layer 710 is trimmed one time after each of the first to fifth (i.e. M−2 times) steps of etching the stacking structures 110. In the present embodiment, M equals to 7, and Q equals to 1.

Figure 6N:
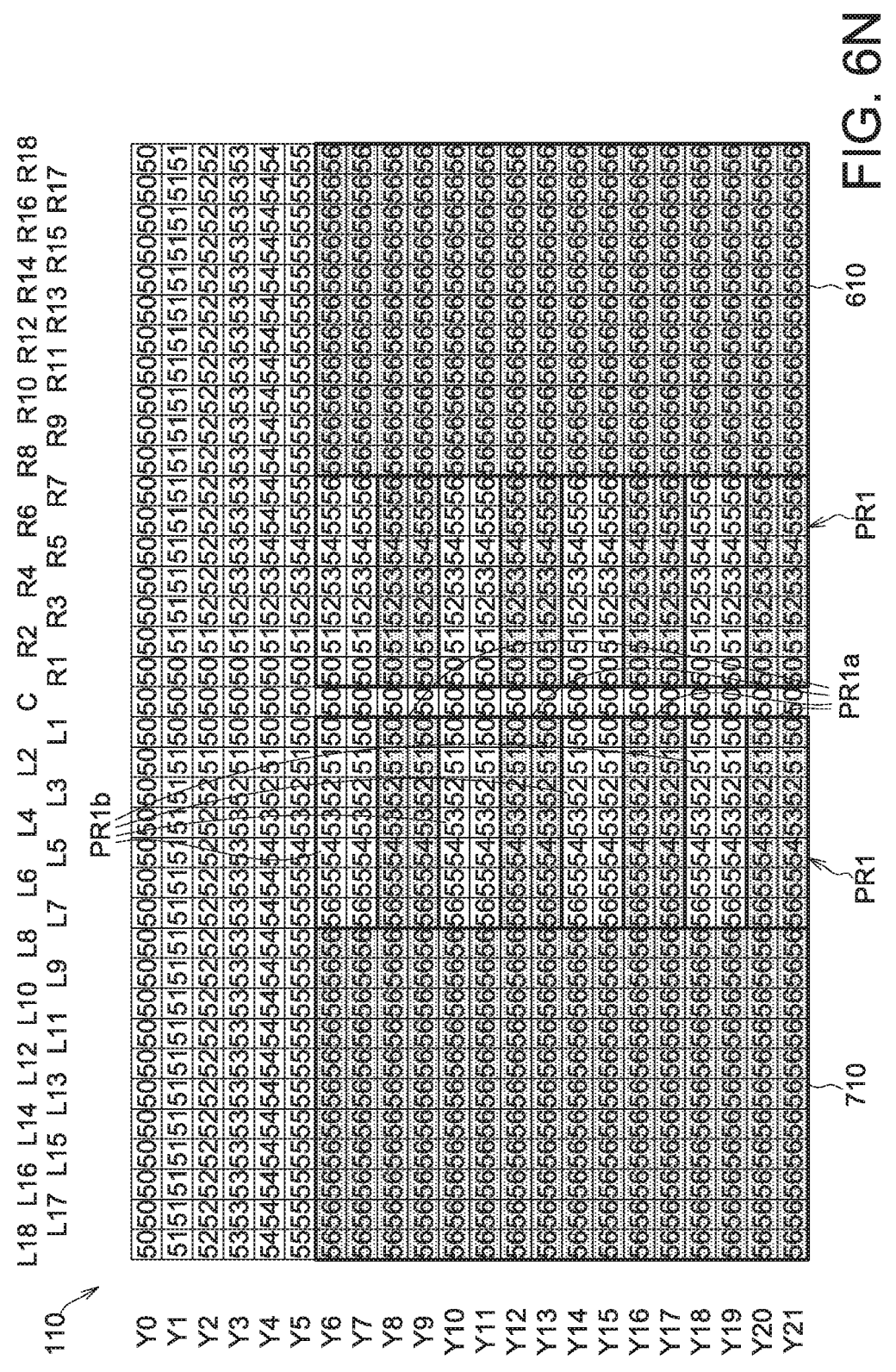

Next, as shown in FIG. 6N, a first mask PR1 (m=1) is provided, and the mask PR1 includes mask regions PR1$a$ and etch regions PR1$b$.

As shown in FIG. 6O, a portion of the conductive layers and the insulating layers in the predetermined contact region 100E is removed. In the embodiment, this step also removes another portion of the conductive layers and the insulating layers uncovered by the photoresist layer and the mask and located outside the predetermined contact region 100B. In this first etching step (N=1), the first mask PR1 is used to etch a portion of the conductive layers and the insulating layers to create an etched depth extending from a surface layer to a conductive layer, and the etched depth equals to 7 layers (P=7) of the stacking structures 110.

Figure 6P:
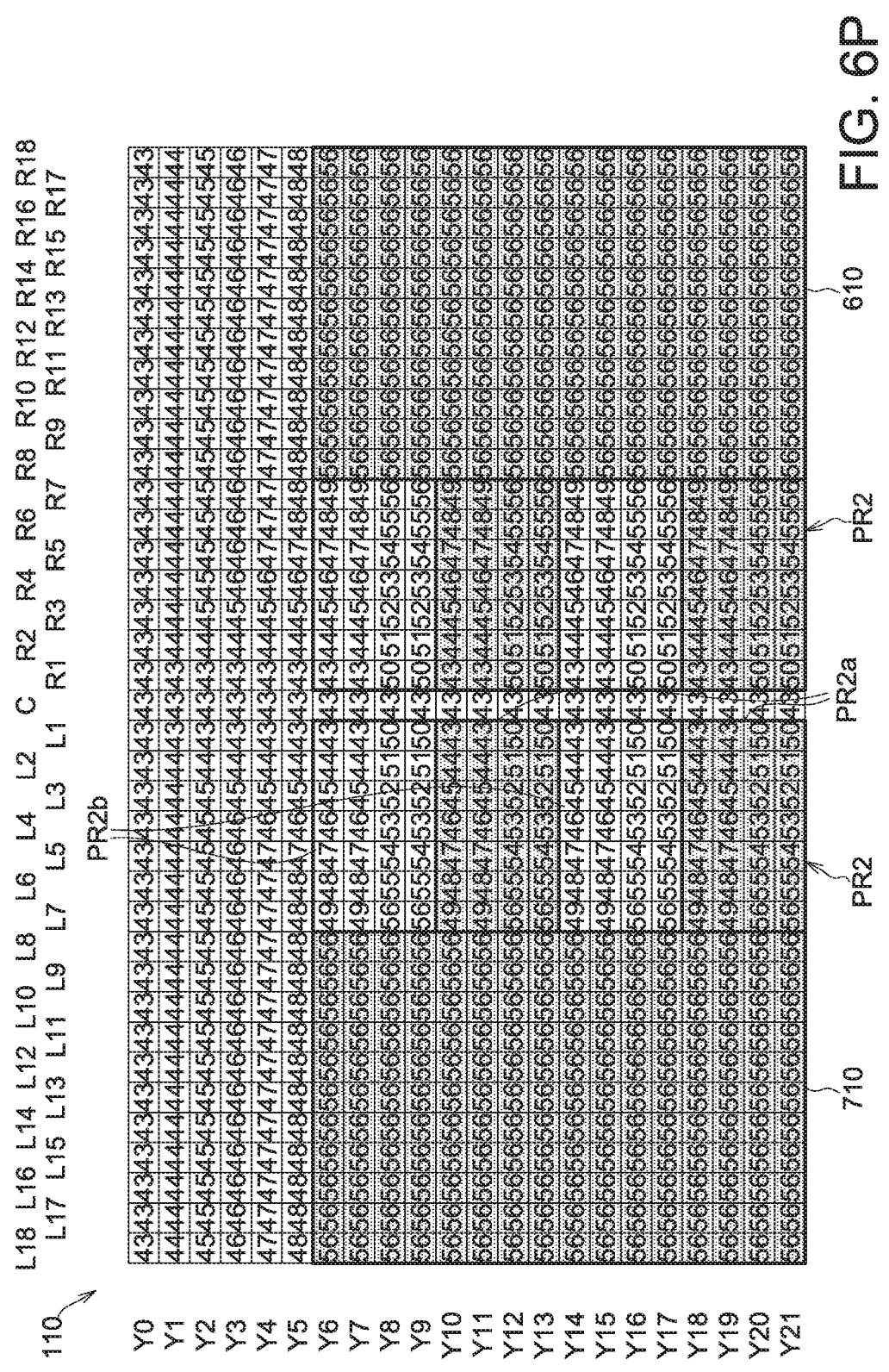
Figure 6Q:
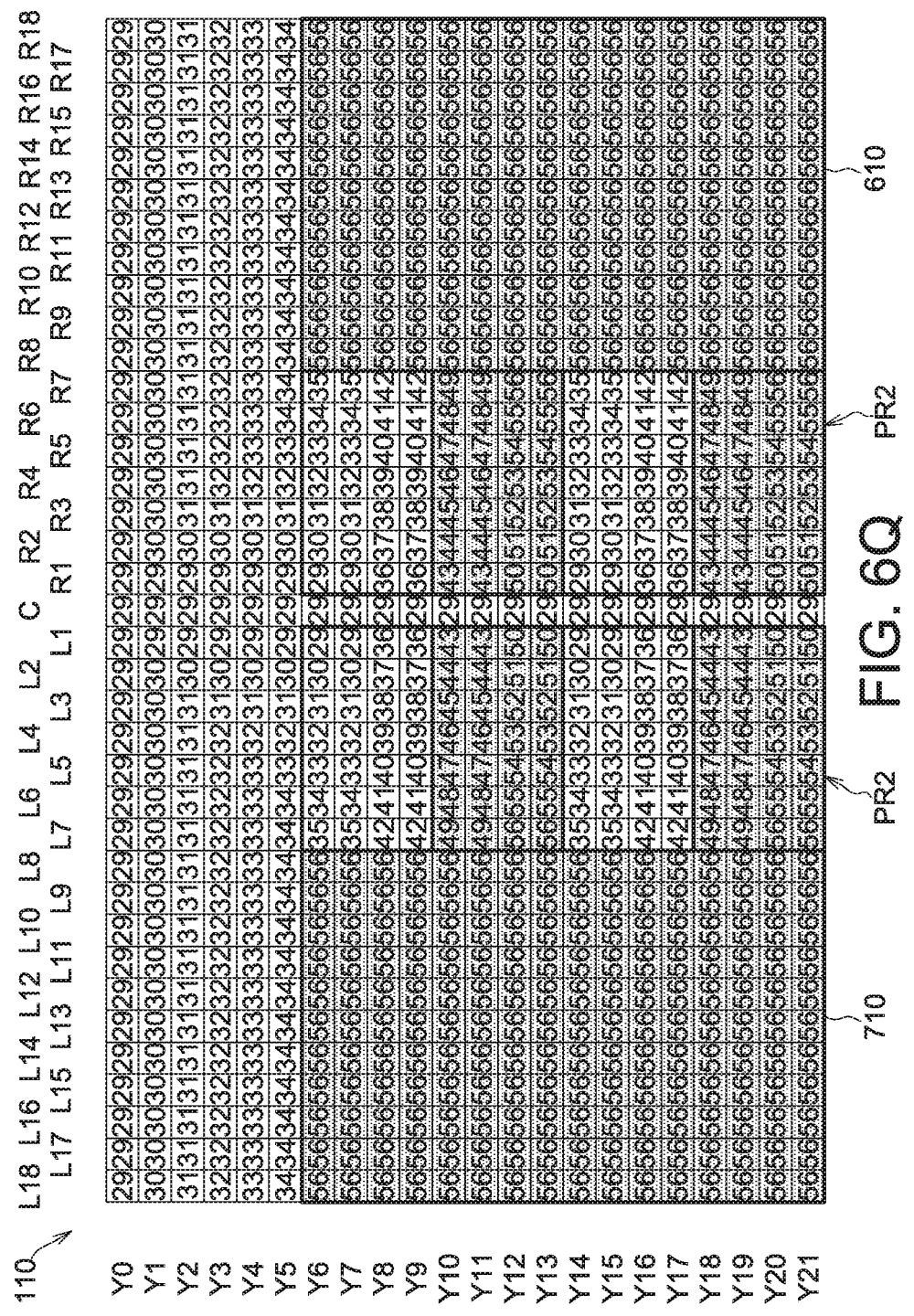

Next, as shown in FIGS. 6P-6Q, the mask PR1 is removed. Then, in a second etching step (N=2), a second mask PR2 is used to etch a portion of the conductive layers and the insulating layers to create another etched depth extending from a surface layer to a conductive layer, and the etched depth equals to 14 layers (2P=14) of the stacking structures 110. The mask PR2 includes mask regions PR2$a$ and etch regions PR2$b$.

Figure 6R:
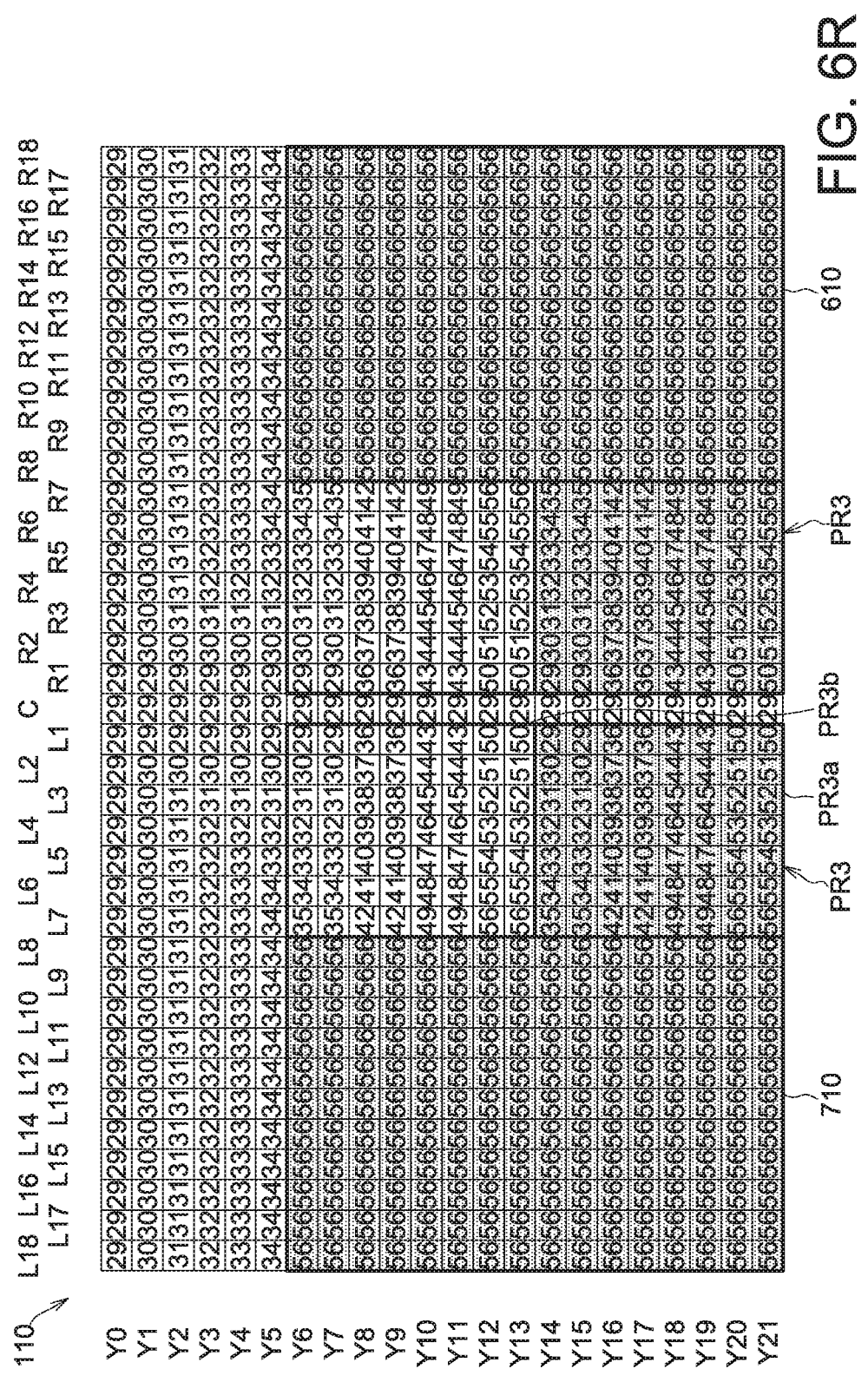
Figure 6S:
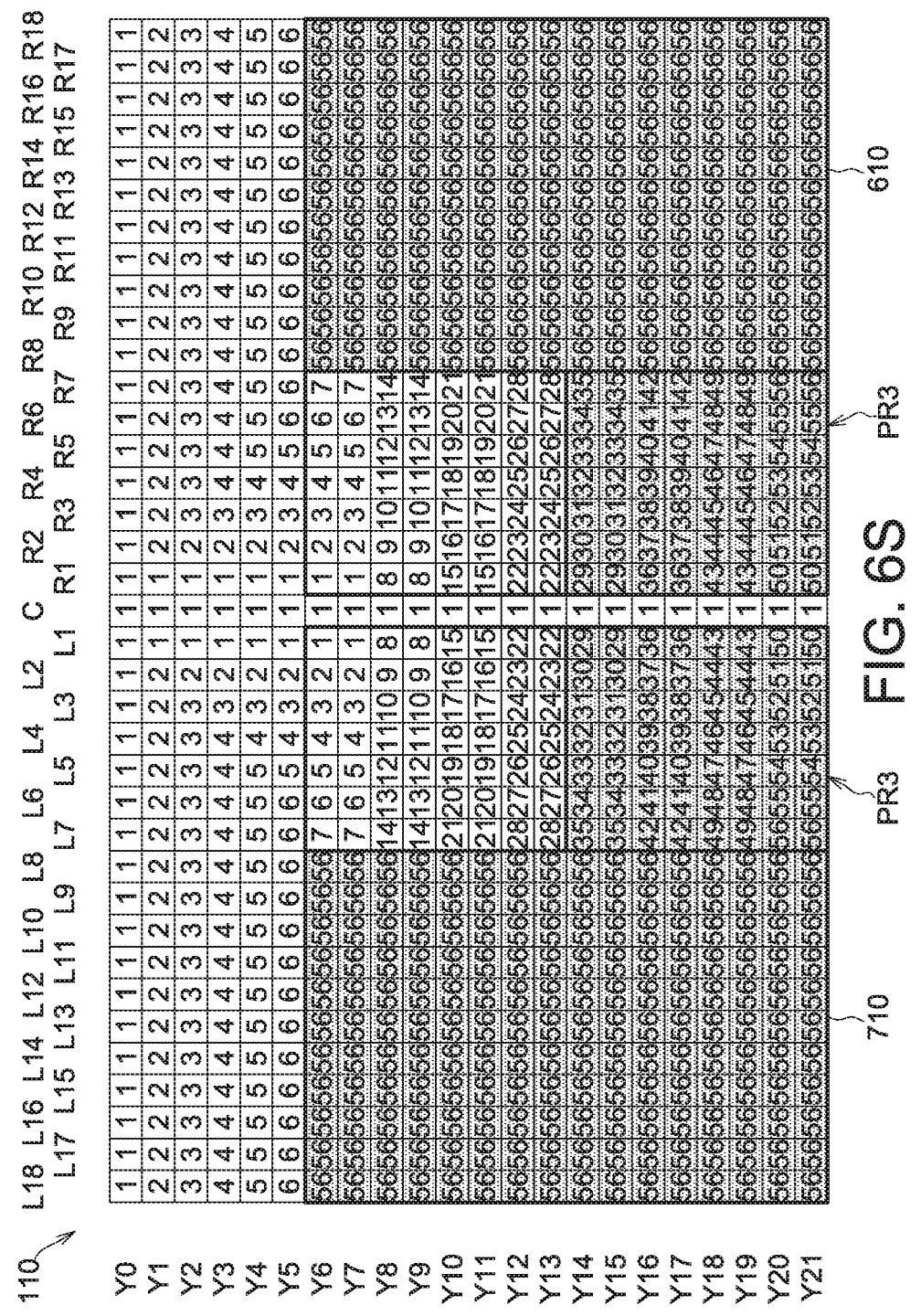

Next, as shown in FIGS. 6R-6S, the mask PR2 is removed. Then, in a third etching step (N=3), a third mask PR3 is used to etch a portion of the conductive layers and the insulating layers to create another etched depth extending from a surface layer to a conductive layer, and the etched depth equals to 28 layers (4P=28) of the stacking structures 110. The mask PR3 includes mask regions PR3$a$ and etch regions PR3$b$. As shown in FIGS. 6N-6S, in the embodiment, the masks PR1, PR2 and PR3 (N=3) are all adjacent to the photoresist layer 710.

Figure 6T:
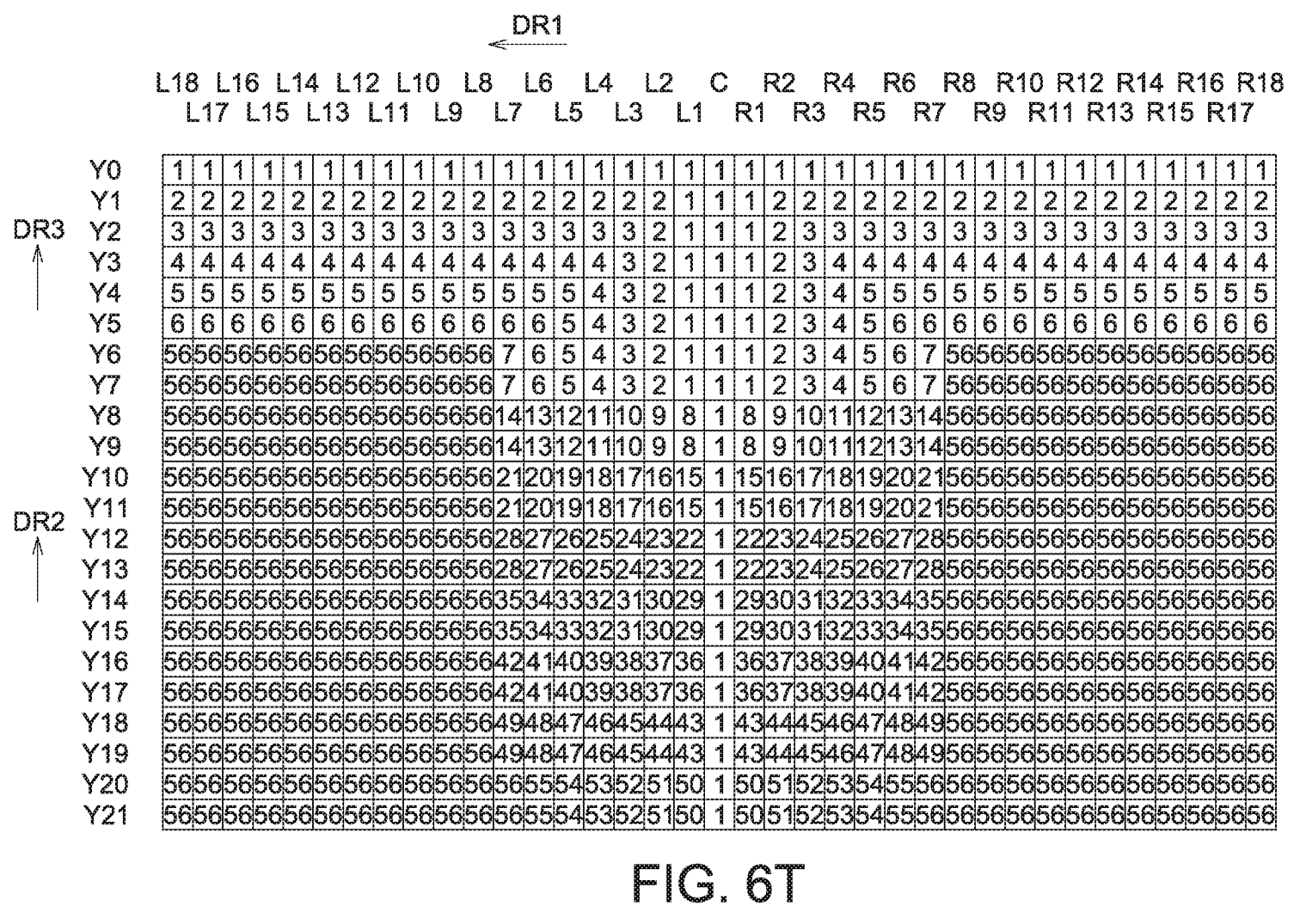

Next, as shown in FIG. 6T, the photoresist layer and the mask are removed. As such, a set of 3 (N=3) etch masks is used for creating 8 (O=8) different numbers of removed layers (0 layer, 7 layers, 14 layers, 21 layers, 28 layers, 35 layers, 42 layers and 49 layers) in the conductive layers and the insulating layers in the contact region, along with forming 7 stages by using the photoresist layer, a total of 56 landing areas are respectively formed on different conductive layers in the contact region, the landing areas are not overlying the conductive layers, and each of the etched depths is extended to each of the corresponding landing areas.

As shown in FIG. 6T, the 8 (O=8) different numbers of removed layers in the contact region 100B created by using the set of N etch masks increase towards a second direction DR2, and the first direction DR1 is different from the second direction DR2.

Next, referring to FIG. 2E, a dielectric fill material may be formed on the 56 landing areas, and 56 contact openings may be formed penetrating through the dielectric fill material. Each of the contact openings is connected to each of the corresponding landing areas, and then a conductive material is filled within the contact openings for forming 56 interlayer connectors (P×O=7×8≤56) (not shown in the present drawing). In the embodiment, the interlayer connectors are arranged in a matrix along the first direction DR1 and the second direction DR2, and the first direction DR1 is substantially perpendicular to the second direction DR2.

Figure 6U:
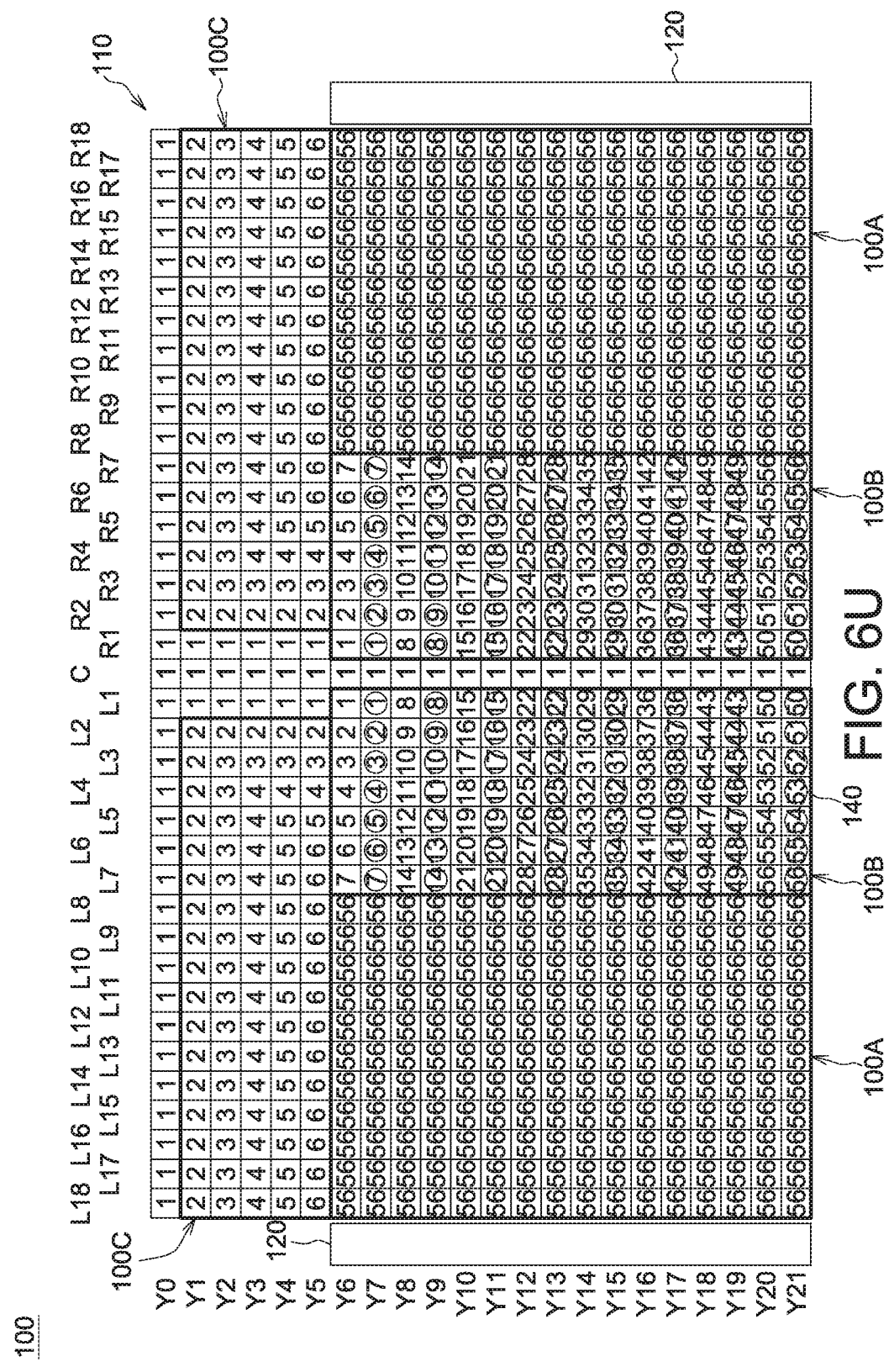

As shown in FIG. 6U, at least a word line decoder 120 is disposed to connect to the array region 100A, and the word line decoder 120 and the dummy region 100C are located on two adjacent sides of the array region 100A respectively.

In the embodiment, as shown in FIGS. 6A-6U, the etching direction of using the photoresist layer and the trimming process is the first direction DR1, and the etching direction of using the set of N etch masks for creating multiple removed layers is the second direction DR2. When the two directions are perpendicular to each other, the area of the dummy region 100C can be minimized, and thus the manufacturing costs can be reduced.

Figure 7A:
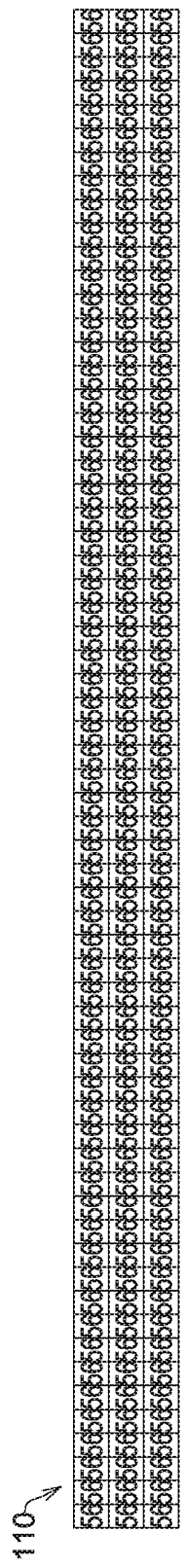
FIGS. 7A-7T show a flow chart of a manufacturing method of a 3D stacking semiconductor device according to a further embodiment.
Figure 7B:
Figure 7C:
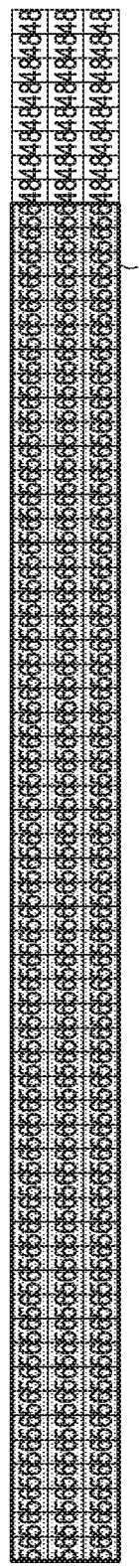
Figure 7D:
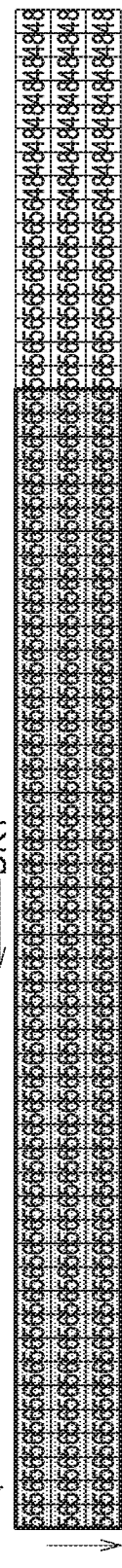
Figure 7E:
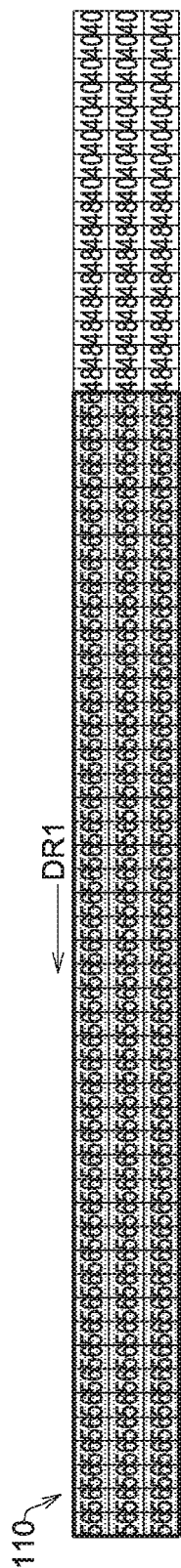
Figure 7F:
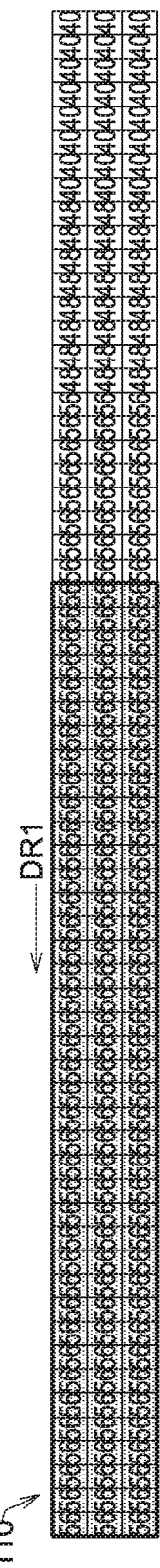
Figure 7G:
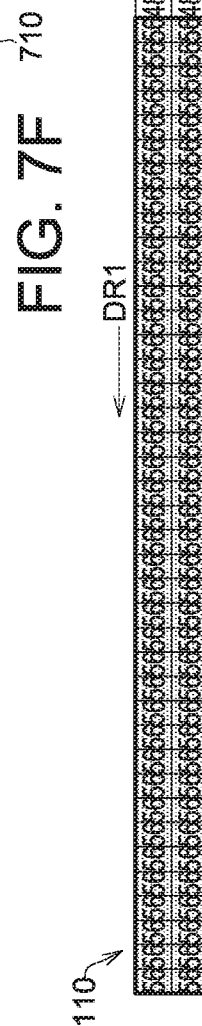
Figure 7H:
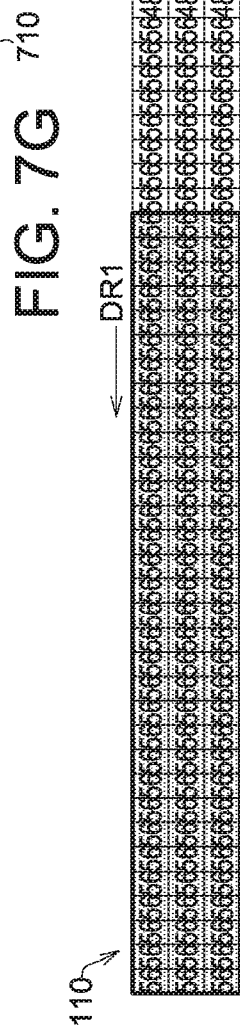
Figure 7M:
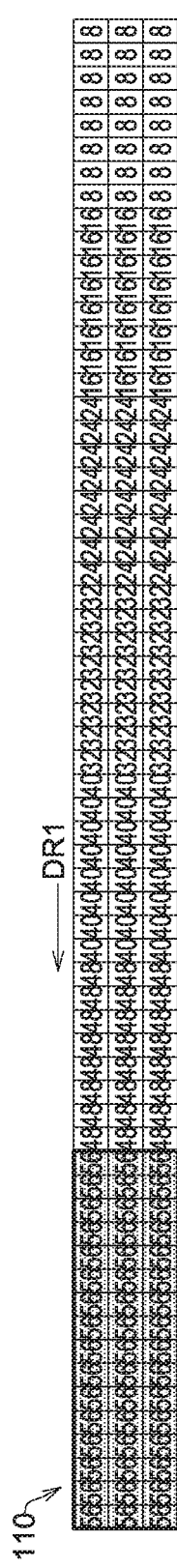
Figure 7N:
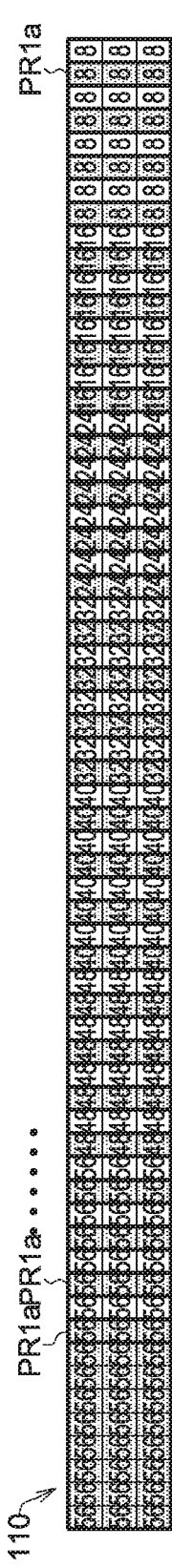
Figure 7O:
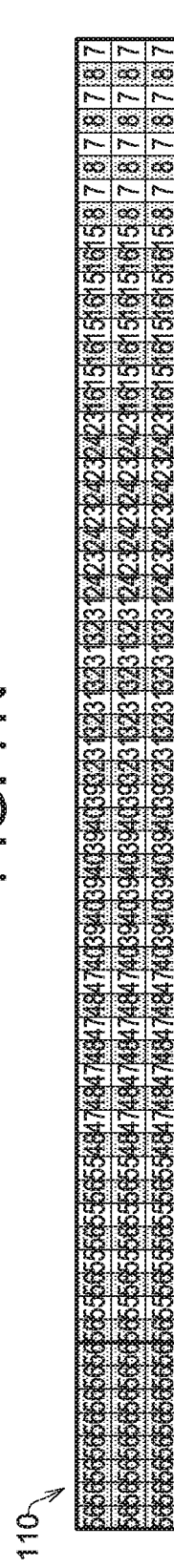
Figure 7P:
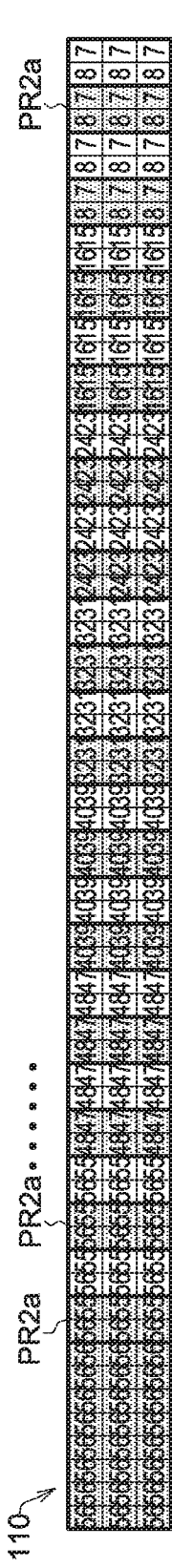
Figure 7Q:
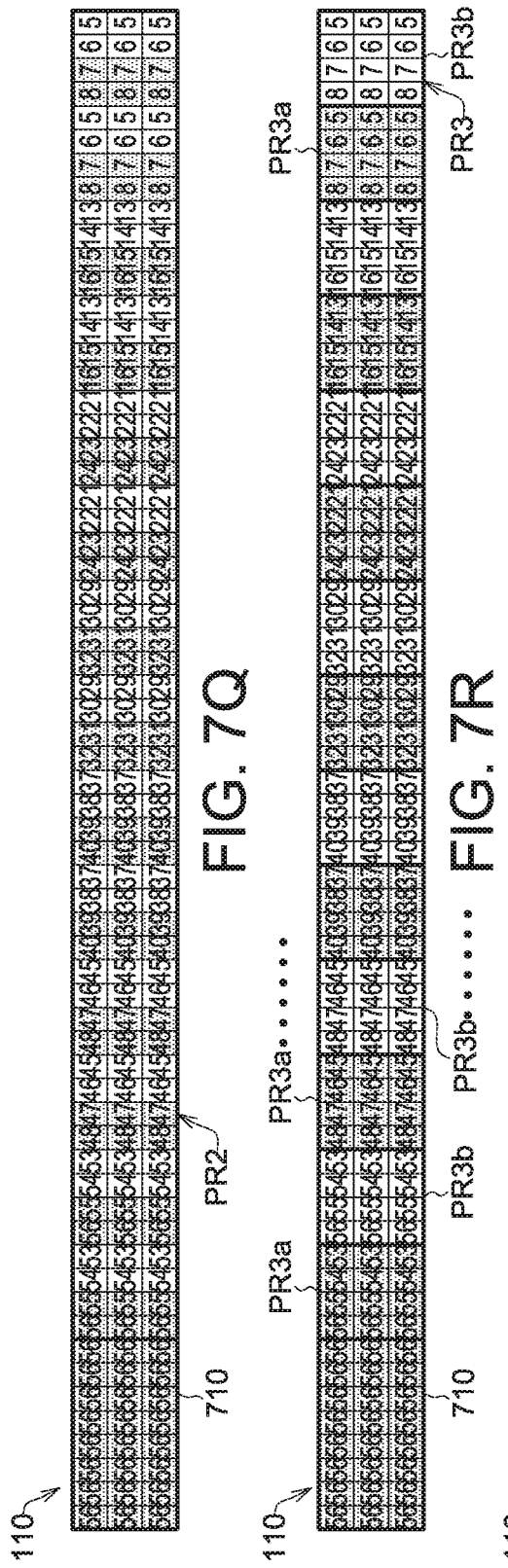
Figure 7R:
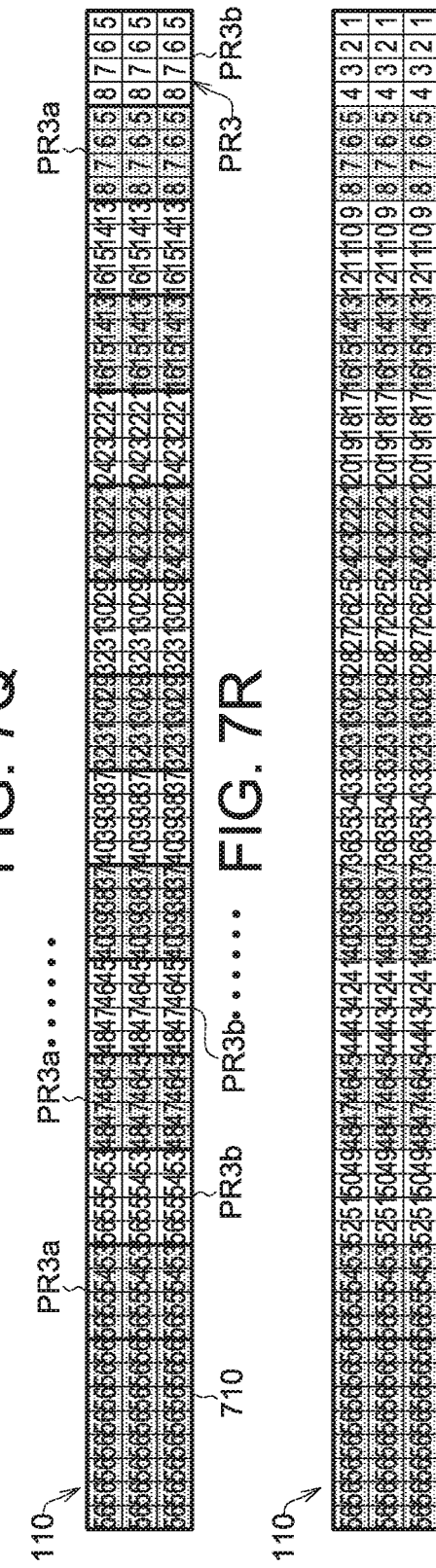
Figure 7S:
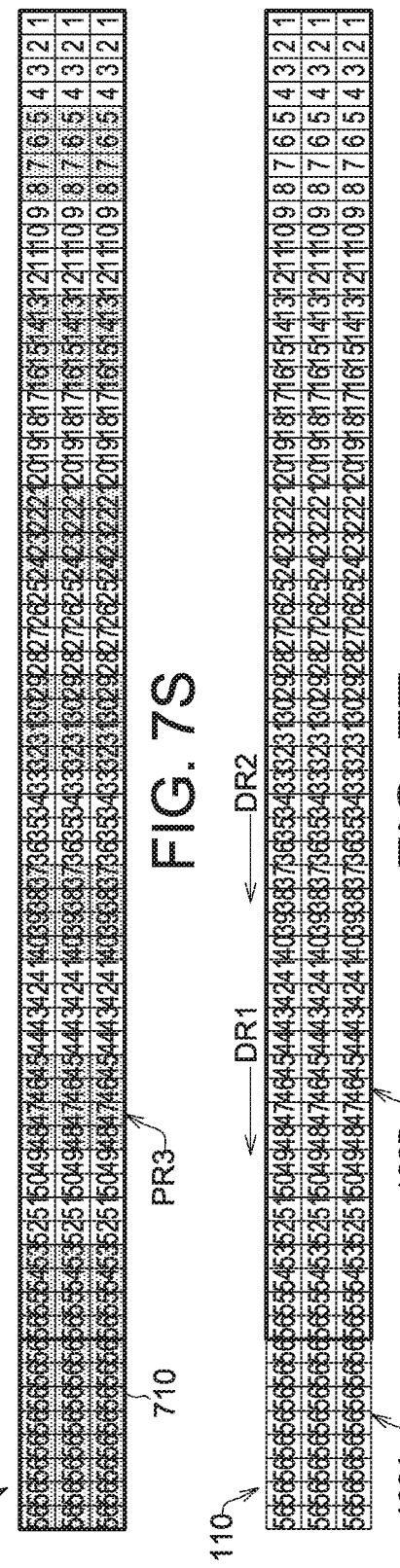
Figure 7T:
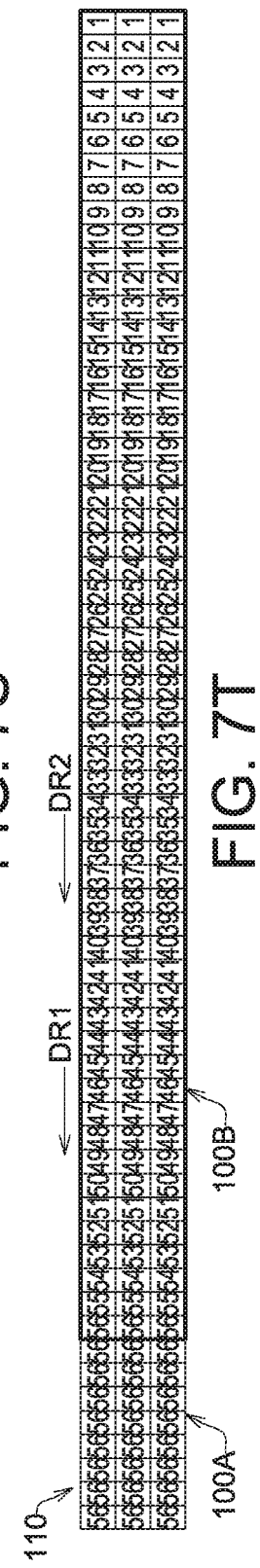

FIGS. 7A-7T show a flow chart of a manufacturing method of a 3D stacking semiconductor device according to a further embodiment. The elements in the present embodiment sharing similar or the same labels with those in the previous embodiment are similar or the same elements, and the description of which is omitted.

As shown in FIG. 7A, the stacking structures 110 are provided. At this time, 56 layers of stacking structures 110 are not etched.

As shown in FIG. 7B, the photoresist layer 710 is provided. The photoresist layer 710 covers part of the surface of the 56 layers of stacking structures 110.

As shown in FIG. 7C, the stacking structures 110 are etched by using the photoresist layer 710 as a mask. In this step of etching the stacking structures 110, the exposed portion of the stacking structures 110 is etched for a thickness of 8 layers (Q=8). That is, 48 layers of stacking structures 110 are left.

As shown in FIG. 7D, the photoresist layer 710 is trimmed for a width for exposing two layers of the stacking structures 110 (i.e. the $48^{th}$ layer and the $56^{th}$ layer). In the embodiment, the width of the photoresist layer 710 is trimmed along the first direction DR1 in the predetermined contact region. In fact, the etching and trimming of the photoresist layer 710 is isotropic, and thus the width of the photoresist layer 710 is trimmed along the third direction DR3 in the predetermined dummy region (not shown in the present drawing).

As show in FIG. 7E, the stacking structures 110 are etched by using the trimmed photoresist layer 710 as a mask. In this step of etching the stacking structure, the exposed portion of the stacking structures 110 is etched for a thickness of 8 layers. That is to say, part of the first layer and the second layer (i.e. the portions originally having 48 layers and 56 layers) of the stacking structures 110 are etched for a thickness of 8 layers.

In FIGS. 7F-7M, the steps of trimming the photoresist layer 710 and etching the stacking structures 110 as shown in FIGS. 7D-7E are repeated, and 7 stages are formed. As shown in FIG. 7M, the steps of trimming the photoresist layer 710 and etching the stacking structures 110 are repeated until the stacking structures 110 in the contact region are exposed outside the trimmed photoresist layer 710.

In FIGS. 7A to 7M, the stacking structures 110 are etched 6 times (i.e. M−1 times). In each step of etching, the stacking structures 110 are etched for a thickness of 8 layers, and the width of the photoresist layer 710 is trimmed one time after each of the first to fifth (i.e. M−2 times) steps of etching the stacking structures 110. In the present embodiment, M equals to 7, and Q equals to 8.

Next, as shown in FIG. 7N, a first mask PR1 (m=1) is provided, and the mask PR1 includes mask regions PR1a and etch regions PR1b.

As shown in FIG. 7O, a portion of the conductive layers and the insulating layers in the predetermined contact region is removed. In this first etching step (N=1), the first mask PR1 is used to etch a portion of the conductive layers and the insulating layers to create an etched depth extending from a surface layer to a conductive layer, and the etched depth equals to 1 layer (P=1) of the stacking structures 110.

Next, as shown in FIGS. 7P-7Q, the mask PR1 is removed. Then, in a second etching step (N=2), a second mask PR2 is used to etch a portion of the conductive layers and the insulating layers to create another etched depth extending from a surface layer to a conductive layer, and the etched depth equals to 2 layers (2P=2) of the stacking structures 110. The mask PR2 includes mask regions PR2a and etch regions PR2b.

Next, as shown in FIGS. 7R-7S, the mask PR2 is removed. Then, in a third etching step (N=3), a third mask PR3 is used to etch a portion of the conductive layers and the insulating layers to create another etched depth extending from a surface layer to a conductive layer, and the etched depth equals to 4 layers (4P=4) of the stacking structures 110. The mask PR3 includes mask regions PR3a and etch regions PR3b.

Next, as shown in FIG. 7T, the photoresist layer and the mask are removed. As such, a set of 3 (N=3) etch masks is used for creating 8 (O=8) different numbers of removed layers (0 layer, 1 layer, 2 layers, 3 layers, 4 layers, 5 layers, 6 layers and 7 layers) in the conductive layers and the insulating layers in the contact region, along with forming 7 stages by using the photoresist layer, a total of 56 landing areas are respectively formed on different conductive layers in the contact region, the landing areas are not overlying the conductive layers, and each of the etched depths is extended to each of the corresponding landing areas.

As shown in FIG. 7T, the 8 (O=8) different numbers of removed layers in the contact region 100B created by using the set of N etch masks increase towards a second direction DR2. In the present embodiment, the first direction DR1 equals to the second direction DR2.

Next, similar to the aforementioned embodiments, interlayer connectors can be formed on the landing areas of the conductive layers for forming the 3D stacking semiconductor device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A 3D stacking semiconductor device, comprising:
   a plurality layers of stacking structures, each of the stacking structure comprising a conductive layer and an insulating layer, the conductive layers and the insulating layers being interlaced, wherein the stacking structures form an array region, a contact region and a dummy region of the 3D stacking semiconductor device, the dummy region is adjacent to the array region and the contact region, and the dummy region is located on a side facing the array region and the contact region; and
   a plurality of interlayer connectors formed in the contact region, each of the interlayer connectors being connected to a corresponding one of the conductive layers;
   wherein a height difference is between the array region and the contact region, and the height difference decreases along the interface between the array region and the contact region towards a direction away from the dummy region.

2. The 3D stacking semiconductor device according to claim 1, wherein the height difference gradually decreases by units of P layer or layers of the stacking structures, and P is an integer equal to or larger than 1.

3. The 3D stacking semiconductor device according to claim 1, wherein the stacking structures further comprise spaced apart stacking blocks, each of the stacking blocks has one of the array region and at least one of the contact region, and the 3D stacking semiconductor device further has two of the dummy regions located on two opposite sides of the stacking blocks respectively.

4. The 3D stacking semiconductor device according to claim 1, further comprising:
  at least a word line decoder connected to the array region, wherein the word line decoder and the dummy region are located on two adjacent sides of the array region respectively.

5. The 3D stacking semiconductor device according to claim 1, wherein the stacking structures in the dummy region and the contact region have stair structures, and a number of stairs in the dummy region is smaller than a number of stairs in the contact region.

6. The 3D stacking semiconductor device according to claim 1, wherein the stacking structures in the dummy region and the contact region have stair structures, and a height of stairs in the dummy region is smaller than or equal to a height of stairs in the contact region.

* * * * *